United States Patent [19]
Ohtake et al.

[11] Patent Number: 5,594,680
[45] Date of Patent: Jan. 14, 1997

[54] NOISE REDUCED CONTACTLESS PARALLEL DATA TRANSFER DEVICE AND METHOD THEREOF

[75] Inventors: Masatoshi Ohtake, Oume; Takeshi Tottori, Kitasouma-gun; Kazunari Nakagawa, Toride; Nobuo Hamamoto, Nishitama-gun; Takehiro Ohkawa, Kunitachi; Yutaka Kinebuti, Suginami-ku, all of Japan

[73] Assignees: Hitachi, Ltd., Tokyo; Hitachi Maxell, Ltd., Osaka-fu, both of Japan

[21] Appl. No.: 411,463

[22] Filed: Mar. 28, 1995

[30] Foreign Application Priority Data

Mar. 29, 1994 [JP] Japan .................................. 6-058486

[51] Int. Cl.$^6$ .............................. G11C 5/06; G11C 7/00
[52] U.S. Cl. ........................... 365/63; 365/194; 365/220
[58] Field of Search .............................. 365/63, 194, 220

[56] References Cited

U.S. PATENT DOCUMENTS 4,962,485 10/1990 Kato et al. .............................. 365/229
5,394,367  2/1995 Downs et al. ................. 365/189.01 X

FOREIGN PATENT DOCUMENTS 3-232207 10/1991 Japan .
4-239990  8/1992 Japan .
5-114055  5/1993 Japan .

*Primary Examiner*—Son Dinh
*Attorney, Agent, or Firm*—Antonelli, Terry, Stout & Kraus

[57] ABSTRACT

A contactless parallel data transfer device which is miniature, highly densed, and highly reliable having a coil block consisting of a first coil group installed in a portable memory and a coil block consisting of a second coil group installed in a data server for transferring access data in parallel between the portable memory (memory card, etc.) and the data server by contactless coupling, wherein the opposite coils of the first and second coil blocks are held close and opposite to each other on a contactless basis, and a parallel pulse group which is transferred in parallel between the both coil blocks is divided at least into a first parallel pulse group consisting of the first number of bits and a second parallel pulse group consisting of the second number of bits, and the parallel transfer timings of the both parallel pulse groups are different from each other, and an induced signal to the neighboring coils of each opposite coil pair of the first and second coil blocks is negated in the opposite phase.

23 Claims, 18 Drawing Sheets

NOISE REDUCED CONTACTLESS PARALLEL DATA TRANSFER DEVICE AND METHOD THEREOF

BACKGROUND OF THE INVENTION

1. Field of the Invention

The present invention relates to a noise reduced contactless parallel data transfer device and method thereof for transferring a signal and voltage on a contactless and parallel basis and more particularly to a contactless parallel data transfer device and method thereof which are used for a portable memory such as a memory card.

2. Description of the Prior Art

A contactless transfer card using an electromagnetic coil has been used as a contactless connection means for supplying data to a memory card recently. For example, as indicated in Japanese Patent Application Laid-Open 3-232207, it is a method that pairs of transmitting coils and receiving coils which have a one-to-one correspondence with each other are installed and necessary data as a 1-bit data signal string is transmitted or received by electromagnetic coupling.

As a type that crosstalk between the neighboring transfer coils is prevented, a device wherein a plurality of transmitting and receiving coils are installed separately from a coil for power supply for data transfer so as to transfer a plurality of bits at the same time and a shield structure is provided between the coils so as to prevent mutual interference between the bits (crosstalk between the bits) is indicated in Japanese Patent Application Laid-Open 4-23990.

On the other hand, as a method for reducing noise which is induced in the power cable and grounding cable, as indicated in Japanese Patent Application Laid-Open 4-254993, there is a type that the driving timing between bits is shifted. Furthermore, as indicated in Japanese Patent Application Laid-Open 5-114055, there is a method that a means for canceling the low frequency component which is induced on the power cable between a pair of transfer coils on the card side is provided.

In Japanese Patent Application Laid-Open 3-232207 and Japanese Patent Application Laid-Open 4-23990 of the aforementioned prior arts, firstly there is a problem imposed that an extremely large peak current which is generated necessarily when large-amplitude information pulses are sent at high speed in parallel by electromagnetic coupling is not taken into account, and not only the scale of power circuit supplied from the outside by electromagnetic coupling becomes large but also a highenergy pulse variation is generated in total, causing crosstalk between the neighboring transfer coils, and the probability of a malfunction in the card becomes high, causing reduction of the reliability.

Particularly as a plurality of transfer coils are mounted in higher density, crosstalk between the coils which is generated necessarily is increased and causes disturbance of highly densed installation of transfer coils.

It is known that an electromagnetic shield means is provided between the coils as a countermeasure therefor. However, it is impossible to shield all the coils, and an effect by the leakage field from the peripheral coils cannot be ignored, and they are obstacles for the practical realization of contactless parallel transfer oils.

Secondly, there is a problem imposed in the energy concentration when parallel transfer pulse signals are example, if 16 channels transfer "1" at the same time when it is assumed that a driving current of 10 mA is necessary for each coupling coil (each channel), a pulse current of 160 mA including an extremely high frequency component is generated. Therefore, a high capacity of the driving source is required and furthermore noise is induced in the power lines. Not only such an instantaneous current is generated but also the power consumption of the peripheral circuit is increased in proportion to speeding-up of the data transfer rate and they are obstacles for the realization of high speed transfer.

Furthermore thirdly, there is problem imposed that in spite of the contactless type using no connector, front-rear reverse insertion is not taken into account, and restrictions for users are imposed, and the operability is not improved.

SUMMARY OF THE INVENTION

An object of the present invention is to provide a contactless parallel data transfer memory card which can be prevented from a malfunction caused by crosstalk between the coils and is miniature, highly densed, and highly reliable without providing a physical shield space.

Another object of the present invention is to provide a contactless parallel data transfer memory card which is miniature, highly densed, and highly reliable by limiting the magnitude of a peak current which is generated during data transfer even when the contactless multi-bit parallel transfer method by electromagnetic coupling is used.

Still another object of the present invention is to provide a highly-reliable contactless parallel data transfer memory card which corresponds to large power consumption during operation at high speed and starts the data transfer operation after ascertaining that the external device really supplies power to the card.

A further object of the present invention is to provide a contactless parallel data transfer memory card which can be inserted into a data transceiver (such as a personal computer) without taking account of the front and rear sides of the memory card and which can be easily operated.

To accomplish the above objects, the present invention consists of:

a portable memory:
a first coil group which is installed in the portable memory so as to transfer access data to the portable memory in parallel;
a data server for supplying at least writing data to the portable memory;
a second coil group which consists of each coil mounted opposite to each coil of the first coil group and is installed in the data server so as to transfer data from the data server to the first coil group;
a contactless holding means for holding the first coil group and the second coil group opposite and close to each other so as to transfer data; and
a parallel pulse generator having a delay means which generates data to be transferred between the first coil group and the second coil group in parallel as a parallel pulse and is installed at least in the data server,
wherein the delay means is a means for dividing the aforementioned parallel pulse at least into a first parallel pulse group consisting of the first number of bits and a second parallel pulse group consisting of the second number of bits and delaying the parallel transfer timing of the second parallel pulse group from the parallel transfer timing of the first parallel pulse group at least by a time which is longer than the pulse width of each bit.

Furthermore, in place of the aforementioned delay means, a means for supplying a part of a transfer signal from at least one coil among the first coil pair to the neighboring receiving side coil in the opposite phase so as to negate the crosstalk component which is generated in the neighboring receiving side coil for the first coil pair among the opposite coil pairs of the first and second coil groups is provided.

Furthermore, the present invention relates to the aforementioned device and method thereof and also to a new IC memory card which is a component thereof. Namely, the IC memory card of the present invention consists of:

a first coil group which is installed so as to transfer access data to a second coil group installed in the data server in parallel opposite to each coil; and at least one means among a means for generating data which is transferred in parallel with the second coil group close and opposite to the first coil group for each coil as a parallel pulse and a means for receiving it as a parallel pulse, wherein the aforementioned parallel pulse consists of a parallel pulse for dividing it at least into a first parallel pulse group consisting of the first number of bits and a second parallel pulse group consisting of the second number of bits and delaying the parallel transfer timing of the second parallel pulse group from the parallel transfer timing of the first parallel pulse group at least by a time which is longer than the pulse width of each bit.

Furthermore, in place of delaying the aforementioned parallel pulse, the IC memory card of the present invention has a means for supplying a part of a transfer signal from the coil of the first coil group corresponding to the first coil pair to the neighboring coil of the first coil group in the opposite phase so as to negate the crosstalk component which is generated in the receiving side coil which is neighboring with the coil pair for the first coil pair among the opposite coil pairs of the first and second coil groups.

More concretely, transfer data of parallel bits which are set in the same timing are divided into, for example, one of 2 to 4 groups (for example, 16-bit data is divided into 4 4bit groups) and a delay circuit of a different delay time and an edge detection differential circuit are inserted for each group.

The data lines of the aforementioned different timing groups are connected to the neighboring coils in a plurality of transmitting coils.

Gate circuits corresponding to a plurality of receiving coils which are sent in the different timing groups and timing generation circuits which are decided in expectation of each timing mentioned above are installed.

Sub-secondary receiving coils are installed for the receiving coils and each sub-secondary receiving coil is connected to the neighboring receiving coil thereof.

A current in the opposite phase which is smaller than the driving current to a transmitting coil is applied to the neighboring receiving coil thereof.

A transmitting driving circuit and receiving amplifier are connected to one end of an electromagnetic coupling coil. To accomplish the aforementioned still another object, an electrode terminal consisting of a spring member for power supply are installed on the external device (server) side and a plate-shaped electrode terminal conductor for external power reception is in close contact with the outer wall on the card side.

The aforementioned electrode terminal conductor for external power reception may be embedded in the groove for preventing cards from front-rear reverse insertion.

A resistor may be inserted between the power source on the external device (server) side and the power supply electrode to external cards.

To accomplish the aforementioned another object, a circuit for delaying the phase of a signal to be supplied to the coil positioned at one end (top or end) of the transmitting coil array for electromagnetic coupling by 90° against the coil positioned at the other end of the coil array may be inserted.

A circuit for detecting the relative phase difference between a received signal from the coil positioned at the top of the receiving coil array for electromagnetic coupling and a received signal from the coil positioned at the end, that is, between signals received by the coils positioned at the both ends of the coil array and a multiplexer circuit for interchanging the sorting sequence of signals received from the aforementioned coil array may be installed.

A means for rectifying output of received signals from the coils positioned at the aforementioned both ends may be installed.

The present invention having the aforementioned constitution has the operation functions indicated below.

The waveform which is obtained by passing parallel data bits through the delay circuit having a different delay time for each group and differentiating the edge of each of the bits can be used as a drive timing pulse for the signal transmitting coils. By doing this, the peak current of the coil driving current is scattered in the time axis direction. For example, in an example that delay circuits of 4 kinks of delay times are installed, the aforementioned peak current is reduced to ¼, and the set capacity of the external supply source is extremely relaxed, and the energy of the pulse noise source in the memory card is reduced. Therefore, a contactless parallel data transfer memory card system which is miniature and highly reliable can be realized.

When the neighboring coils of the signal transfer coil group (array) are driven by using pulses having different timings, the intensity of leak field is reduced because the magnetic lines of force (flux) of the neighboring coils are not added and emphasized and the crosstalk amount for the other coils is reduced. Therefore, a physical countermeasure such as shielding between the coils becomes unnecessary and a contactless parallel data transfer memory card system which is miniature and highly reliable can be realized.

When the expected timing generator generates a pulse having an expected period width when a signal is expected to be induced to the corresponding receiving coil as a gate signal of the gate circuit, it operates so that crosstalk noise which is generated other than the aforementioned expected period, for example, at the drive timing to the neighboring coil will not pass through the gate circuit. By doing this, for example, even when large crosstalk noise is induced from the neighboring coil, the system will not be affected. Therefore, a contactless parallel data transfer memory card system which is miniature and highly reliable can be realized.

When each sub-secondary receiving coil is set to the number of turns so that it can receive a voltage equal to the crosstalk induced voltage to the neighboring coil and connected in series so as to have the opposite phase of that of the neighboring coil, the crosstalk component of the neighboring coil is offset in plus and minus. By doing this, a malfunction caused by crosstalk generated in the neighboring coil can be prevented and a contactless parallel data transfer memory card system which is highly reliable can be realized.

A driving signal in the opposite phase which is applied to the neighboring transmitting coil operates in pair with the neighboring coil so as to offset the crosstalk component to the opposite neighboring receiving coil. By doing this, a malfunction caused by crosstalk generated in the neighboring coil can be prevented and a contactless parallel data transfer memory card system which is highly reliable can be realized.

When the transmitting driving circuit and receiving amplifier are connected to the same coil, the data which is transferred in the previous cycle can be sent back to the gap of the aforementioned driving signal which is shifted in timing. By doing this, a read check after written into the memory, that is, so-called a read after write check can be performed without the number of transfer coils being increased and the peak current being increased. Therefore, a contactless parallel data transfer memory card system which is miniature and highly reliable can be realized.

It is desirable to provide two power supply electrode terminal conductors from the external device (server) side to the card side (one on each side), so that a comparatively strong structure can be used and a small mounting space is available compared with the means for supplying comparatively large power magnetically by the transformer structure. By doing this, a contactless parallel data transfer memory card system which can correspond to large power consumption at the time of high-speed operation and is miniature and highly reliable can be realized.

By the structure of the electrode terminal conductor for reception of power supply which is provided in the cut groove for preventing front-rear reverse insertion on the card side, a contact failure caused by soil which is generated by touching of fingers because the terminal conductor is positioned in the narrow concave of the card can be prevented. By doing this, a contactless parallel data transfer memory card system which can correspond to large power consumption at the time of high-speed operation and is miniature and highly reliable can be realized.

It can be ascertained that an actual load is connected by checking a potential drop of the resistor inserted on the power supply line on the external device side, that is, it can be detected that the card which transmits and receives data is inserted in the external device (server) and power supply is started. By doing this, a situation that an error occurs in the power connection and high speed transfer of data is started in the state that no power is supplied to the card from the outside can be prevented. Therefore, a contactless parallel data transfer memory card system which is miniature and highly reliable can be realized.

Shifting the phase difference of signals to be supplied to the coils positioned at the both ends of the transmitting coil array for electromagnetic coupling at 90° means that the insertion receiving side (for example, a personal computer, etc.) of the memory card declares the left and right positions of the insertion surface without using a mechanical method by a projection. By doing this, detection and correction of a malinsertion of the memory card can be executed easily and a contactless parallel data transfer memory card which can be operated easily can be provided. The circuit for detecting the phase difference of signals which are induced to the coils positioned at the both ends of the receiving coil array for electromagnetic coupling operates so as to detect whether the memory card is inserted with the surface thereof (in the memory card of a thin plate structure of hexahedron, the two longitudinal sides, two transverse sides, and two remaining surfaces in the ascending order of area are expressed by front side and rear side for convenience) up or right or with the surface of the memory card down or left reversely. By doing this, when the state is recognized as the aforementioned reverse insertion state (the memory card is inserted with the surface thereof down or left), the multiplexer circuit operates so as to interchange the left and right of the sorting sequence of the receiving coil array, that is, the data sorting sequence, so that there is no need to take the front and rear sides of the memory card into account when the memory card is to be inserted and a contactless parallel data transfer memory card which can be operated easily can be provided.

The means for rectifying signals which are induced to the coils positioned at the both ends of the receiving coil array for electromagnetic coupling operates so as to generate a DC voltage from the aforementioned signal for detecting front-rear interchanging insertion. By doing this, the means functions as an external power receiving coil for data transfer and a front-rear interchanging insertion detection coil. Therefore, there is no need to add external power receiving coils and there is no need to take the front and rear sides of the memory card into account when the memory card is to be inserted from a viewpoint of power supply. As a result, a contactless parallel data transfer memory card which can be operated easily can be provided.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

Prior to explanation of the concrete structure of the embodiments, the background factors which regulate the requirements of the structure, particularly crosstalk between transfer coils will be described. A transfer coil module which has been produced by way of trial and experimented in consideration of the data of the experiment conducted so as to examine actually generated crosstalk and of the restrictions on the external dimensions and which is equivalent to the embodiments will be explained hereunder with reference to the accompanying drawings.

Figure 16A:
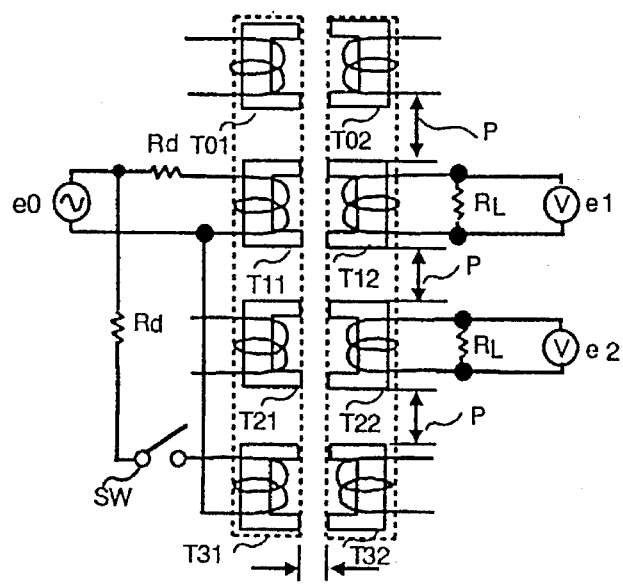
FIGS. 16(a) and 16(b) are drawings showing a crosstalk experimental circuit diagram of an electromagnetic coupling transfer coil and experimental data thereof.
Figure 16B:
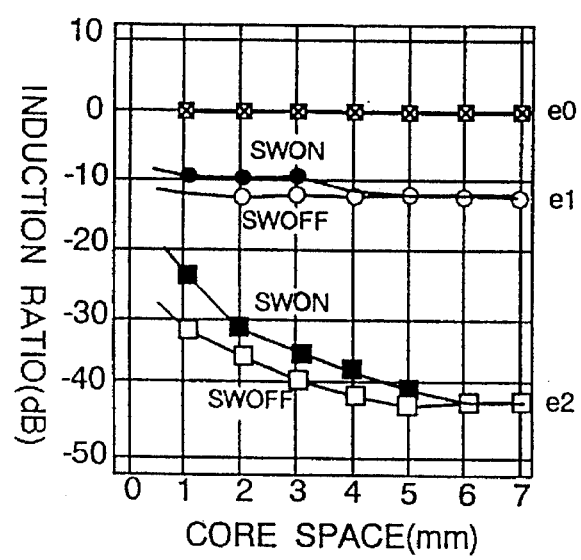

FIG. 16(a) shows a measurement circuit for the interchannel crosstalk experiment. Secondary (receiving) coils T02, T12, T22, and T23 which correspond to primary (transmitting) coils T01, T11, T21, and T31 are ferrite core bobbins which are wound with enameled wires 10 to 20 turns respectively and a kind of electromagnetic coupling transformer is formed by combining each opposite coils, for example, T01 and T02, T11 and T12, etc. The space between the coil ferrite cores in the primary and secondary coil blocks (coil arrays) is assumed as an experimental variable which can vary, and the gap between the primary coil ferrite and the secondary coil ferrite is assumed as a parameter which is fixed, and several cases have been examined. In the actual experiment, this parameter value is handled as a variable. As shown in FIG. 16(a), as a primary driving signal, a pulse signal with an e0-V amplitude is applied to the primary coils T01 and T31 via a resistor Rd (in the experiment, e0: 5 V, Rd: 470 ohm). As shown in the drawing, the resistor Rd (470 ohm) and the contact of the toggle switch are connected to T31 in series. A load resistor RL (470 ohm) is connected to the secondary coil T12 and a regular receiving level e1 is observed on the oscilloscope. A load resistor RL (470 ohm) is also connected to the neighboring coil T22 and a crosstalk level e2 is observed by the same means. FIG. 16(b) shows the measured data indicating the experimental results thereof. The horizontal axis indicates the neighboring space of each ferrite core which is wound with a coil in the coil block and the vertical axis indicates the induced voltage to the secondary side which is expressed by decibel when the primary driving voltage e0 is assumed as 0 dB (for example, when the voltage is attenuated to 1/10 and transmitted, the induced voltage becomes −20 dB). The regular induced voltage e1, that is, the secondary induced voltage is almost constant such as −11 dB (about 1.4 V) regardless of the core space and the ON or OFF state of the switch (see FIG. 16(a)). However, the induced voltage to the neighboring coil, that is, the crosstalk voltage e2 becomes higher as the core space becomes narrower. For example, when the neighboring space is 1 mm, the crosstalk voltage is −30 dB (about 1/32) and crosstalk of 156 mV is generated. When the switch (see FIG. 16(a)) is turned off so as to let a driving current also flow through the coil T31, it is found that the crosstalk voltage e2 to the secondary coil neighboring to both of them is increased up to −24 dB (about 1/16 of 5 V, 312 mV).

Figure 17A:
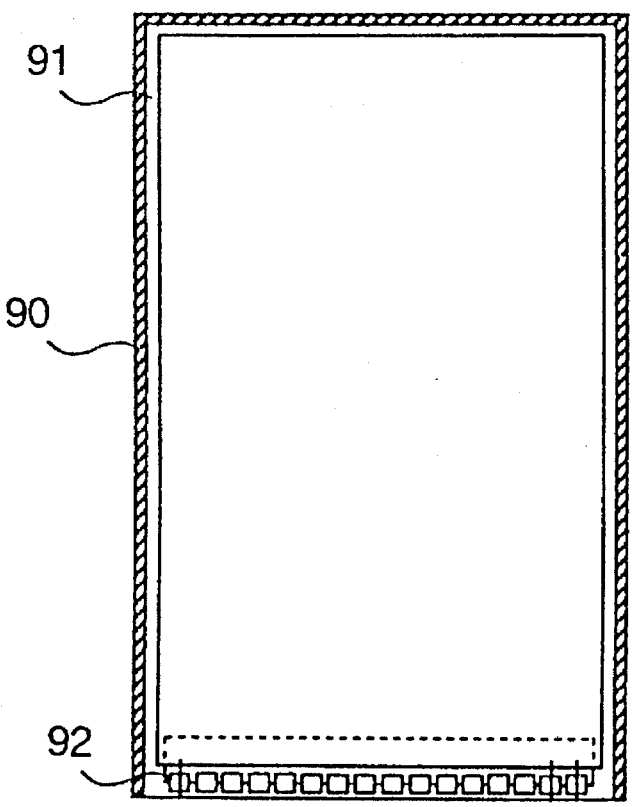
FIG. 17 is a drawing showing the appearance of a PCMCIA standard memory card and the mounting status of a contactless coil array.
Figure 17B:

FIG. 17 is an external view of a memory card of Type II of PCMCIA (Personal Computer Memory Card International Association) Standard which is executed as a conventional standard and a drawing when application of contactless parallel transfer coils is supposed. This Type II memory card is specified as follows: The length is 85.6 mm, and the width is 54.0 mm, and the thickness is 3.3 mm at the peripheral part necessary for insertion and the conventional contact type connector part and 5.0 mm at the center. A printed circuit board 91 for mounting components such as a memory is installed inside a card case 90 which is formed in the above dimensions and a 68-conductor contact connector is generally mounted to the connector part (the lower part in the drawing). To realize contactless transfer like the present invention, it is necessary to mount an electromagnetic coupling coil in place of the aforementioned contact 68-conductor connector. In this case, it is possible to use 16 conductors at first so as to conform to the aforementioned standard and to avoid the crosstalk shown in FIG. 16(b). According to the aforementioned standard, also for a contactless parallel transfer coil, it is requested that the longitudinal dimension of a core holder 92 is at most 50 mm. When 16 channels of coils are arrayed, a coil pitch of at most 3 mm is necessary as shown in the drawing.

Figure 18A:
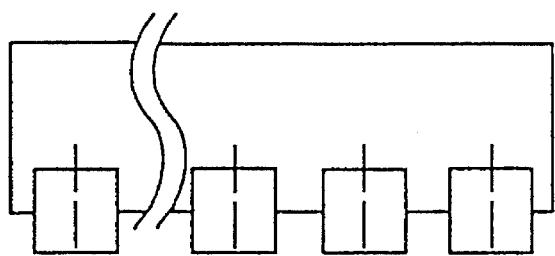
FIG. 18 is an external view of a practical realization coil array which is used in the embodiments.
Figure 18B:
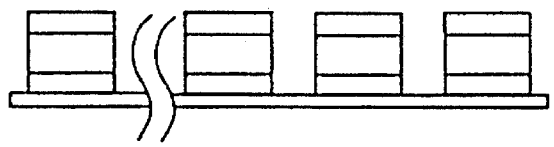
Figure 18C:
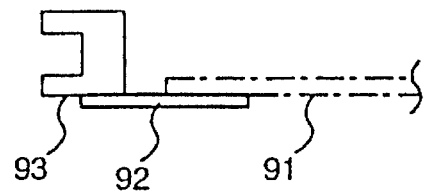

FIG. 18 is an external view of a coil array which is used in this embodiment and being put to practical use. In the core holder 92, as shown in the drawing, 16 "$$-shaped" individual ferrite cores 93 of 2 mm square are mounted at a space of 1 mm (the range which can be put to practical use is decided from the experimented results shown in FIGS. 16(a) and 16(b)). The aforementioned core holder 92 uses a non-dielectric such as a glass member, is a plate-shaped substance of 4 mm in length by 48 mm in width by 0.3 mm in thickness, and is mounted and soldered onto the printed circuit board 91 face to face.

A case of a coil block of 16 channels is described in detail above. However, when a contact connector part is used, as described in the aforementioned standard, 68 conductors are used practically. Therefore, it is desirable to make the parallel transfer device of the present invention which is a contactless connector more highly densed. In this case, particularly crosstalk between the neighboring coils as shown in FIG. 16(a) comes into a problem. It is clear in FIG. 16(b) that such electromagnetically inductive noise is suddenly increased when the neighboring coil space becomes less than 1 mm. When high densification is extremely promoted, it is expected that such crosstalk will generate not only electromagnetic induction but also electrostatic induction between the coils.

The present invention provides a new contactless parallel data transfer device which avoids the aforementioned crosstalk and concentration of the pulse energy and a portable memory using it. The concrete constitution content thereof will be explained hereunder using each embodiment. Firstly, the first embodiment will be explained hereunder with reference to the drawings.

Figure 1:
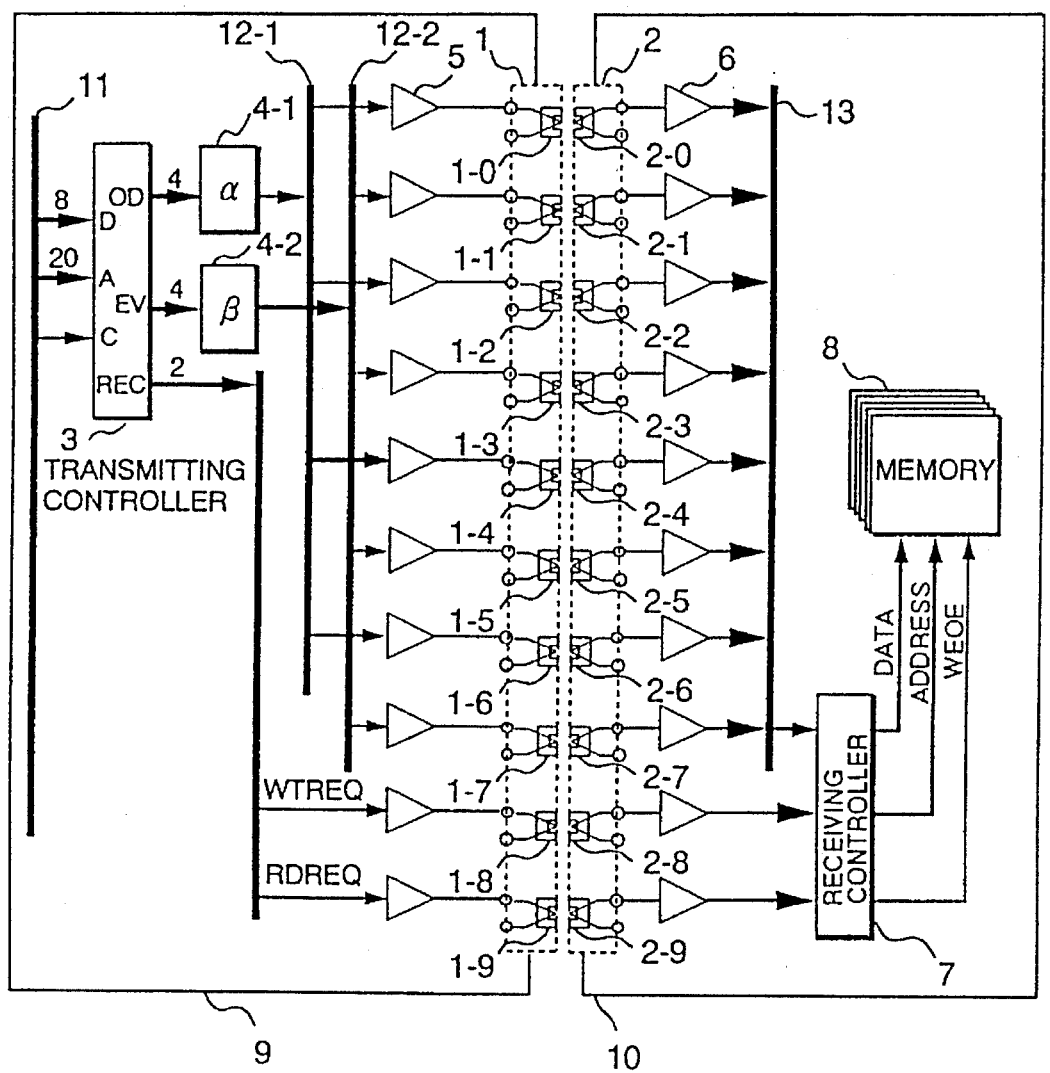
FIG. 1 is a block diagram of a data server and a contactless parallel transfer memory card showing the first embodiment.

FIG. 1 is a block diagram of a data server (a data server such as a personal computer) and a contactless parallel transfer memory card which are used in the first embodiment and only the parts relating to data transfer are extracted. The data bus, address bus, and dedicated control line included in an internal bus 11 of a data server 9 using the personal function input data to a data transmitting controller 3 and convert and output it to a 8-bit data parallel read-write control signal. Namely, at the top of data transfer, the designated address number on the memory card side (designated by 20 bits in the embodiment) is outputted as 8-bit parallel data (data in byte units) by divided into three times first, and data strings to be transmitted are outputted sequentially in byte units thereafter, and a write request signal WTREQ into the memory (when data is read by the personal computer, a read request signal RDREQ) is generated at the same time every data output. The 8-bit output data is divided into 4 bits of even numbers (bit 0, bit 2, bit 4, and bit 6) and 4 bits of odd numbers (bit 1, bit 3, bit 5, and bit 7) and the former even number bit data string and the latter odd number bit data string are separately inputted to an $\alpha$-timing delay circuit 4-1 and a $\beta$-timing delay circuit 4-2 respectively. The $\alpha$-timing delay circuit 4-1 and the $\beta$-timing delay circuit 4-2 consist of a register and pulsation circuit which are controlled by the reference phase timing $\alpha$ of the 2-phase clock control concept (a system that two timing references of the reference phase as a reference and the delayed phase which is delayed by 180° from the reference are provided within one cycle of the main clock) and a register and pulsation circuit which are controlled by the delayed phase timing $\beta$ respectively (a detailed illustration is omitted). The output of the $\alpha$-timing delay circuit 4-1 is a pulsation (a pulse with a width of ¼ of the maximum data transfer cycle) RZ (return to zero: a data representation system that the signal level is always 0, becomes 1 only when data is 1, and is returned always to 0 after the predetermined time elapses) signal which is synchronized with the aforementioned $\alpha$ timing. The signal drives even number coils 1-0, 1-2, 1-4, and 1-6 of a transmitting coil array 1 via an $\alpha$-phase data bus 12-1 and a coil driver 5 (flows the predetermined current through the coils). The aforementioned $\beta$ timing delay circuit 4-2 outputs the pulsation RZ signal which is synchronized with the $\beta$ timing and drives odd number coils 1—1, 1-3, 1-5, and 1-7 of the transmitting coil array 1 via a $\beta$-phase data bus 12-2 and the coil driver 5. Individual coils 2-0 to 2-7 constituting a receiving coil array 2 which is installed at the position corresponding to the transmitting coil array 1 receive electromagnetically inductive signals which are in proportion to the driving currents to the transmitting coils 1-0 to 1-7. Namely, the pulsation RZ signal which is synchronized with the $\alpha$ timing is received by the receiving coils 2-0, 2—2, 2-4, and 2-6, and the pulsation RZ signal which is synchronized with the $\beta$ timing is received by the receiving coils 2-1, 2-3, 2-5, and 2-7, and the signals set set-reset flip-flops (a detailed constitution illustration is omitted) constituting the inside of a receiving controller 7 in their timings via a receiving amplifier 6 and a receiving data bus 13 (only when the data is 1). The receiving controller 7 recognizes that the three bits at the top of the transfer data string indicate address information, updates the address bus data to a memory 8 (the writing top address is set), sends subsequent received data to the data bus of the memory 8, generates a write enable (WE) signal at the same time (reflected by the write request signal WTREQ which is received beforehand via a transmitting coil 1-8 and a receiving coil 2-8), and adds 1 to the aforementioned address bus data using the back edge of the WE signal so as to make preparations for writing the next memory address. The content of the memory 8 is read when a read request signal RDREQ form the personal computer 9 (data server) is sent to the receiving controller 7 via a receiving coil 2-9 by driving a transmitting coil 1-9. The reading circuit for it is complicated, so that an illustration is omitted.

Figure 2:
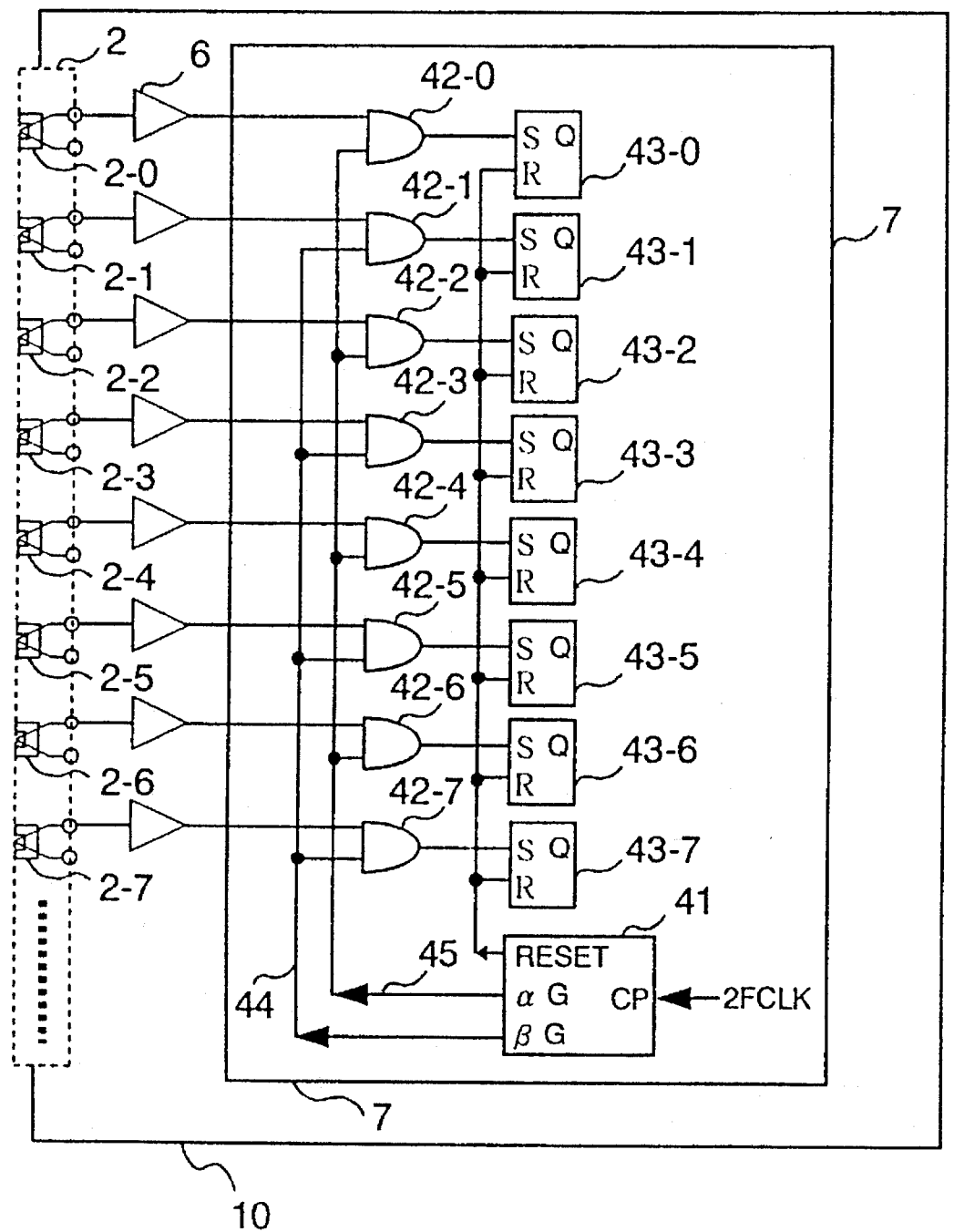
FIG. 2 is a logical development elevation showing the input part of a contactless parallel transfer memory card.

FIG. 2 is a logical development elevation which shows the signal input part of a contactless parallel transfer memory card a little more in detail. As to the inside of a contactless transfer memory card 10, only the receiving coil array 2, the receiving amplifier 6, and the data input related part of the receiving controller 7 are illustrated and the other constitution blocks are omitted so as to prevent complication. A gate signal generator 41 generates a gate signal ($\alpha$G) 45 for receiving a signal sent in the $\alpha$ timing, a gate signal ($\beta$G) 44 for receiving a signal sent in the $\beta$ timing, and a reset signal for set/reset type flip-flops 43-0 to 43-7 using a system clock 2fCLK (supplied from the data server by another means) as a base. On the other hand, coils 2-0, 2—2, 2-4, and 2-6 belonging to the group for receiving an $\alpha$ timing transmitting signal among the receiving coil array 2 input the aforementioned $\alpha$ gate signal 45 to gate circuits 42-0, 42-2, 42-4, and 42-6 which input the signal as another input via the receiving amplifier 6 and the gated signals are connected to the set terminal conductors of the flip-flops 43-0, 43-2, 43-4, and 43-6 respectively, and coils 2-1, 2-3, 2-5, and 2-7 belonging to the group for receiving a $\beta$ timing transmitting signal among the receiving coil array 2 also input the aforementioned $\beta$ gate signal 44 to gate circuits 42-0, 42-2, 42-4, and 42-6 which input the signal as another input via the receiving amplifier 6 and the gated signals are connected to the set terminal conductors of the flip-flops 43-1, 43-3, 43-5, and 43-7 respectively, and transfer data for one byte is set in the flip-flops 43-0 to 43-7. Namely, the signal component other than the neighborhood of the timing which is predicted to be transferred by the action of the gate circuits 42-0 to 42-7 is inhibited from transferring to the flip-flops 43-0 to 43-7.

Figure 3:
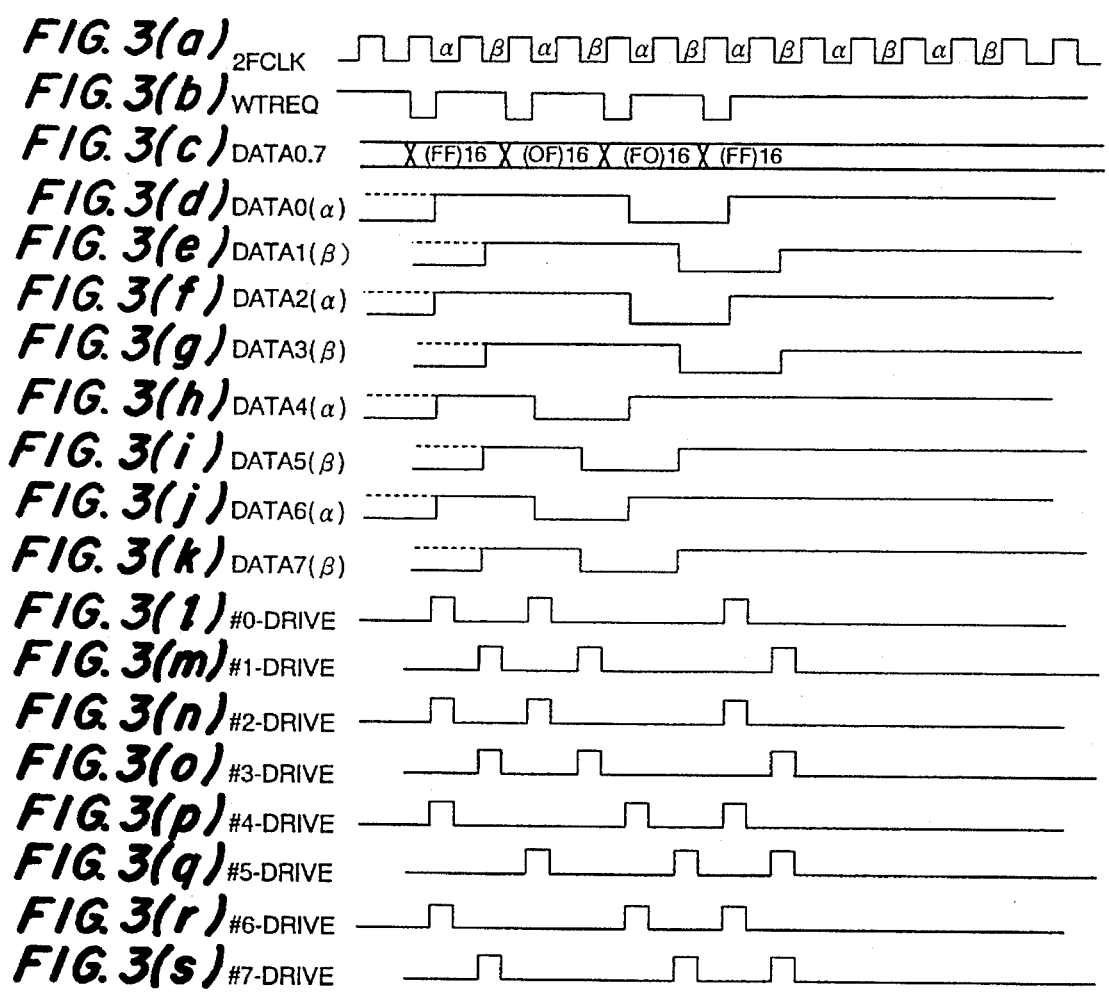
FIG. 3 is a time chart for explaining a part of the first embodiment.

FIG. 3 is a time chart of the data part (the address part is omitted) for explaining the first embodiment mentioned above. It will will be explained hereunder by referring to FIG. 1. The clock which is given to the transmitting controller (3 shown in FIG. 1) is a square wave signal 2fCLK having a frequency (20 MHz in this embodiment) which is 2 times of the transfer frequency and data DATA0 to DATA7 which are to be written simultaneously with a write command WTCOM from the controller (the data server 9 shown in FIG. 1) of the host computer to the external memory card are given. DATA0 to DATA7 are assumed and illustrated as FF (all the bits of 8-bit data are 1), 0F (the 4 high-order bits are 0 and the 4 low-order bits are 1), F0 (the 4 high-order bits are 1 and the 4 low-order bits are 0), and FF (the last data) which are given in hexadecimal. To the latch register in the transmitting controller, the group (DATA0$\alpha$, DATA2$\alpha$, DATA4$\alpha$, DATA6$\alpha$) which operates in the $\alpha$ timing and the group (DATA1$\beta$, DATA3$\beta$, DATA5$\beta$, DATA7$\beta$) which operates in the $\beta$ timing are distributed alternately and data is set at the trailing edge of each timing. The output signals (#0-DRIVE, #2-DRIVE, #4-DRIVE, and #6-DRIVE) in which the register outputs DATA0$\alpha$ to DATA6$\alpha$ and a NOT signal of the $\alpha$ part of the aforementioned signal 2fCLK are ANDed and the output signals (#1-DRIVE, #3-DRIVE, #5-DRIVE, and #7-DRIVE) in which the register outputs DATA1$\beta$ to DATA7$\beta$ and a NOT signal of the $\beta$ part of the aforementioned signal 2fCLK are ANDed are the driving current waveforms to the individual coils (1-0 to 1-7 shown in FIG. 1) of the corresponding transmitting coil array (1 shown in FIG. 1).

Figure 4:
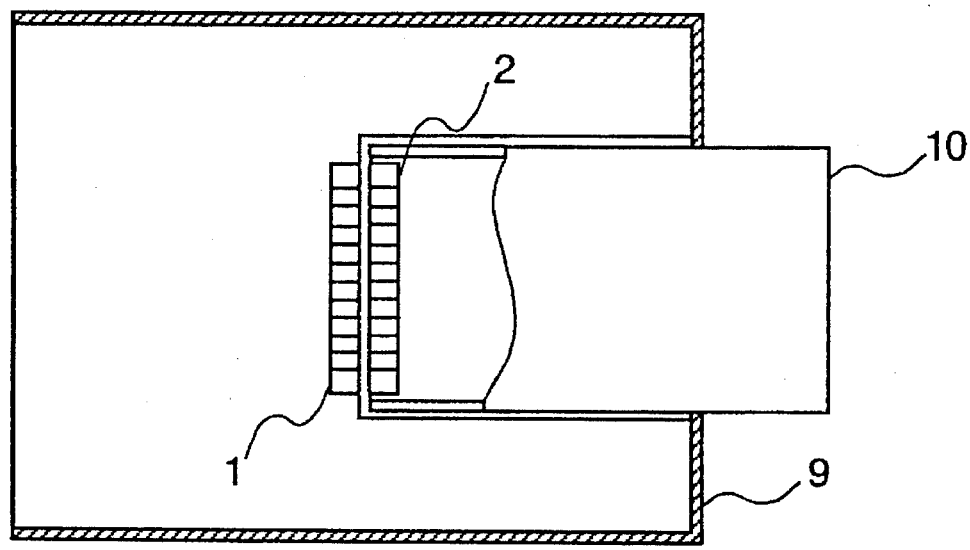
FIGS. 4(a) and 4(b) are external views when a memory card is inserted into the data server.
Figure 4:
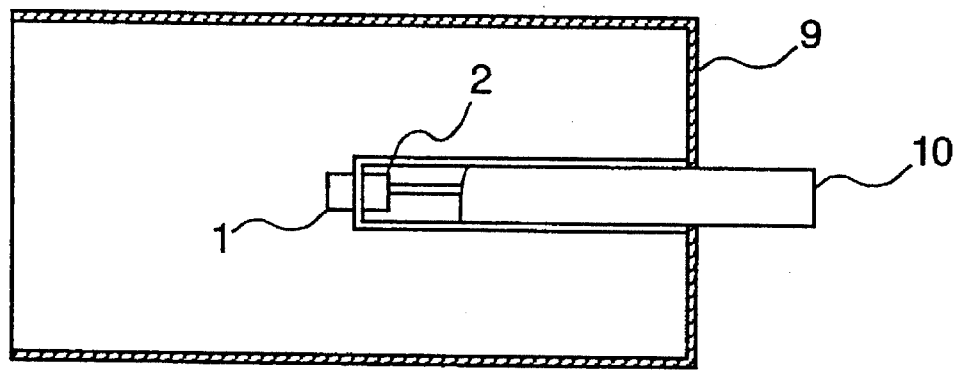

FIGS. 4(a) and 4(b) are external views showing the mounting status when data is transmitted or received in this embodiment. FIG. 4(a) is a cross sectional view viewed from top and FIG. 4(b) is a cross sectional view viewed from side. When the contactless parallel transfer memory card 10 in which the transmitting coil array 1 is installed on the innermost side of the cut of the data server 9 in parallel with the bottom and the receiving coil array 2 is installed in correspondence with the transmitting coil array 1 is inserted into the cut, data is transferred by the electromagnetic coupling action between the coils. When the gap between the transmitting coil array 1 and the receiving coil array 2 is made as narrow as possible in this case, the transfer efficiency is improved. Therefore, a structure that force is acted in the direction for adhering the two coil arrays 1 and 2 closely to each other by the mutual action using the attraction by a permanent magnet or the force of repulsion of a mechanical spring is used (not shown in the drawing).

According to this embodiment, the peak value of the current accompanying driving the transmitting coils becomes ½ and particularly when data is sent back from the card side, that is, when memory data is read (an illustration and explanation are omitted), not only it contributes to miniaturization of the power circuit but also the energy of the noise signal source is reduced by half. Therefore, a contactless parallel transfer memory card system of an electromagnetic coupling type which is highly reliable can be realized. The neighboring coils are driven in different timings and furthermore a noise signal which is induced in the driving timing for the neighboring coils is eliminated by the gate circuit, so that there is no need to worry about a malfunction due to crosstalk noise which is a fatal fault when many induction coils are used and a contactless parallel transfer memory card system which is extremely highly reliable can be provided.

In the aforementioned embodiment, data is distributed and transferred in two different timings. However, it is naturally possible to increase the number of distribution timings to 3, 4, or 5. As the number increases, the time required for transmitting or receiving data prolongs. However, on the other hand, the peak current is leveled and decreased, so that the aforementioned effect will be more increased.

Next, the second embodiment will be explained with reference to the drawings. The second embodiment is an example that a countermeasure for coping with a case that a card is inserted with the front and rear sides (upper and lower sides) in the reverse direction (see FIG. 4 of the first embodiment) is taken.

Figure 5:
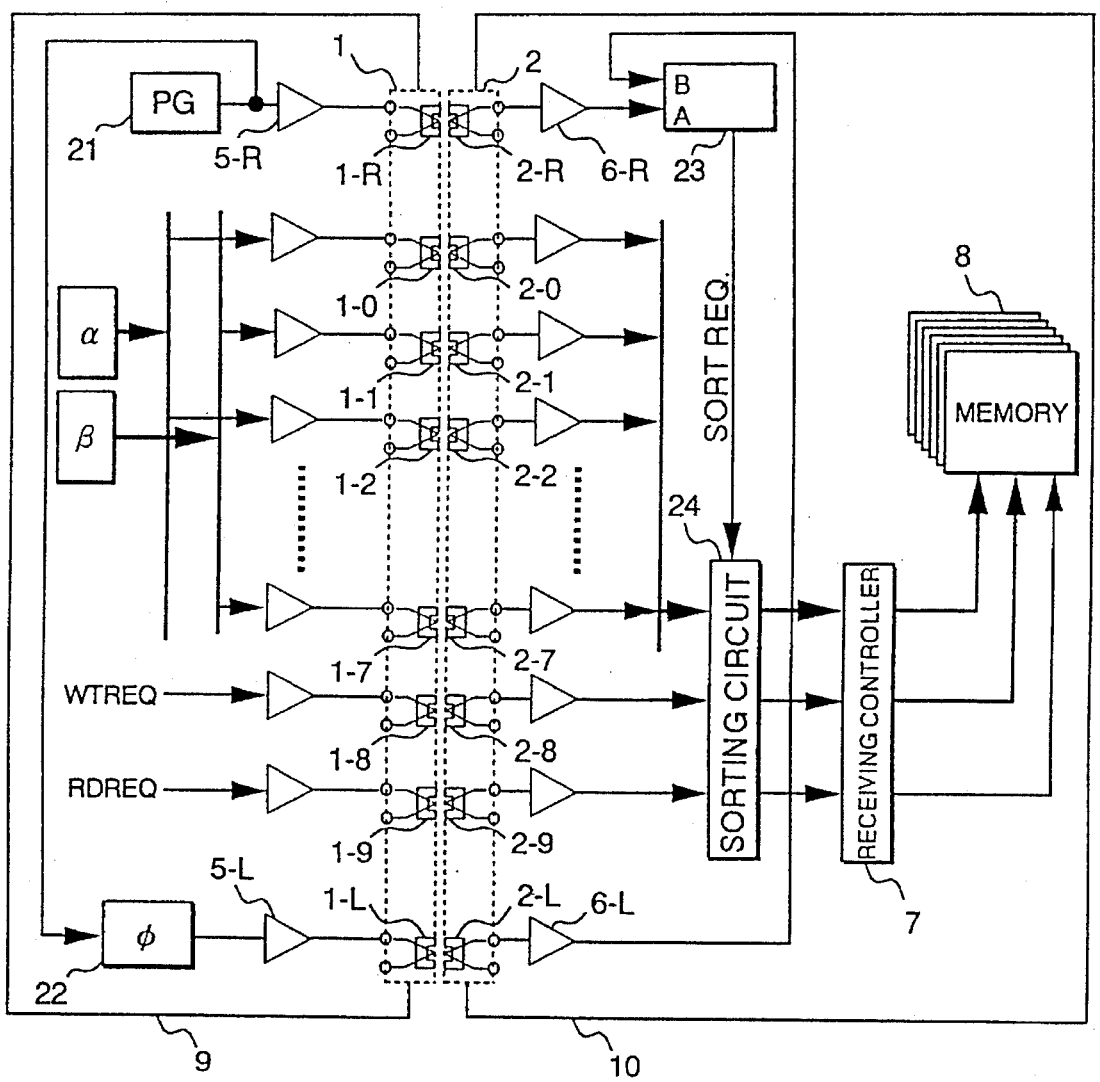
FIG. 5 is a block diagram of a data server and a contactless parallel transfer memory card showing the second embodiment.

FIG. 5 is a block diagram in which only the parts relating to data transfer of the data server 9 (personal computer) and the contactless parallel transfer memory card 10 which are used in the second embodiment are extracted. This drawing corresponds to FIG. 1 in the first embodiment and the main difference on the data server 9 side from FIG. 1 is that special signal transmitting coils 1-R and 1-L and circuits for supplying signals to the above additional coils are added at both ends of the coils 1-0 to 1-7 and 1-8 and 1-9 which constitute the transmitting coil array 1 and the main difference on the memory card 10 side is that special signal transmitting coils 2-R and 2-L and circuits for processing signals received from the above additional coils are added at both ends of the coils 2-0 to 2-7 and 2-8 and 2-9 which constitute the receiving coil array 2. Therefore, explanation of parts which is duplicated with the explanation in FIG. 1 will be omitted basically. A square wave signal which is generated by a pulse generator 21 drives the transmitting coil 1-R which is one of the additional coils via a coil driver 5-R, delays the signal phase by 90° by a phase shifter 22 at the same time, and then supplies a signal to the coil 1-L which is the other of the additional coils via a coil driver 5-L. On the other hand, the memory card 10 side supplies a signal which is received by the first additional receiving coil 2-R and amplified and shaped by a receiving amplifier 6-R and a signal which is received by the second additional receiving coil 2-L and amplified and shaped by a receiving amplifier 6-L to a phase detector 23 respectively so as to compare the relative phase difference and generates a sorting command signal for a sorting circuit 24. Assuming that, as shown in the drawing, the first receiving additional coil 2-R receives a signal from the first transmitting additional coil 1-R and the second receiving additional coil 2-L receives a signal from the second transmitting additional coil 1-L (the status that the phase of the input B of the phase detector is delayed by 90° from that of the input A), the phase detector decides that it is a normal insertion that the memory card 10 is inserted into the data server 9 with the front side up and will not issue the sorting command to the sorting circuit 24 (namely, the status which is explained in FIGS. 1 and 2 in the first embodiment is held). When the memory card 10 is inserted with the rear side up on the contrary, only the memory card 10 enters the status that it is rotated in a 180° arc from the status shown in the drawing for the data server 9. Namely, the first transmitting additional coil 1-R faces the second receiving additional coil 2-L, and the transmitting coil 1-0 faces the receiving coil 2-9, and the transmitting coil 1—1 faces the receiving coil 2-8, and the other coils face the corresponding coils in the same way by interchanging the places thereof vertically, and finally the second transmitting additional coil 1-L faces the first receiving additional coil 2-R. In this status (the status that the memory card 10 is inserted with the rear side up as mentioned above), the phase of the input A of the phase detector 23 is delayed by 90° from that of the input B, so that the phase detector issues the sorting command to the sorting circuit 24 and the sorting circuit 24 interchanges the bits sequentially vertically in the same signal array as that at the time of normal insertion so as to allow the operation at the time of normal insertion. Namely, the interchanged with the receiving data line of the receiving coil 2-0 which is symmetrical about the center of the receiving coil array 2 and then the receiving data line of the receiving coil 2-8 is interchanged with the receiving data line of the receiving coil 2-1, the receiving data line of the receiving coil 2-7 with the receiving data line of the receiving coil 2—2, the receiving data line of the receiving coil 2-6 with the receiving data line of the receiving coil 2-3, and the receiving data line of the receiving coil 2-5 with the receiving data line of the receiving coil 2-4 in the same way.

Figure 6:
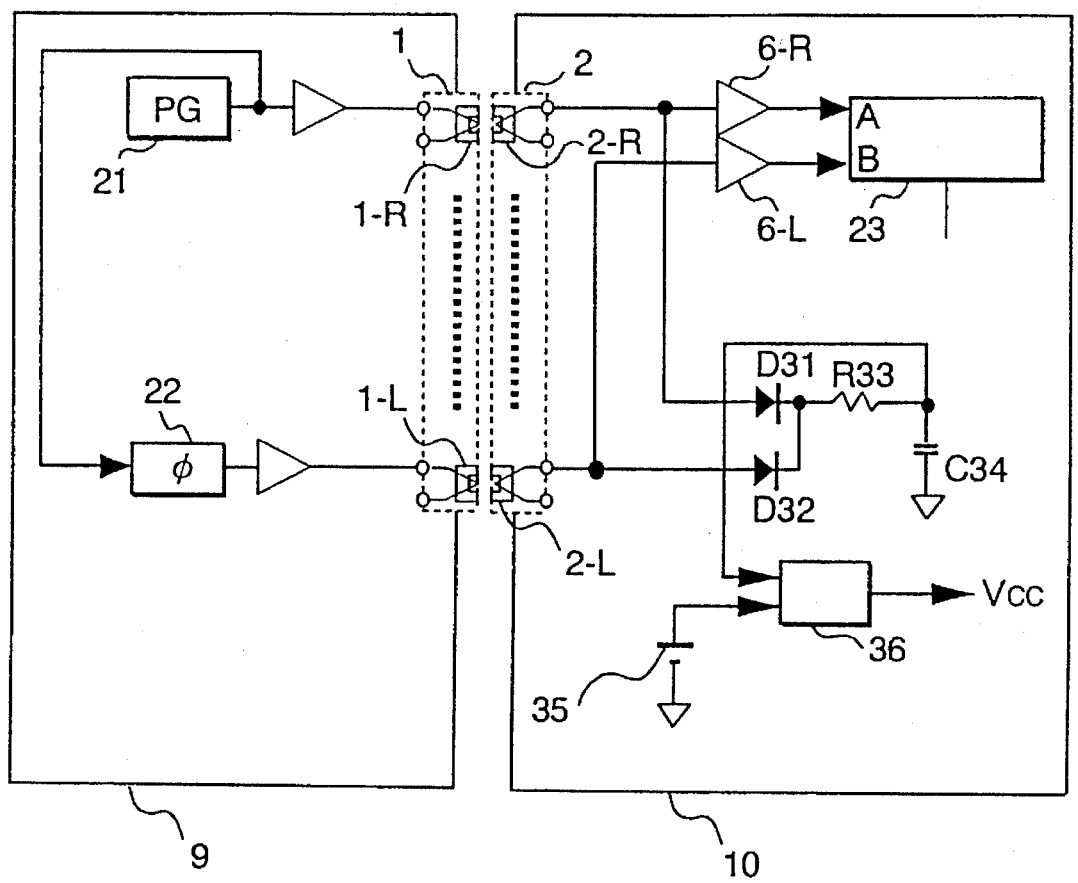
FIG. 6 is a block diagram showing an example of external power supply when data is transferred.

FIG. 6 is a block diagram showing the power supply method to a card when data is transferred which is used in this embodiment. An output signal of the pulse generator 21 is applied to the first transmitting coil 1-R for discriminating the insertion direction which is additionally installed at one end of the transmitting coil array 1 as it is and the signal of the pulse generator 21 whose phase is delayed by 90° by the phase shifter 22 is applied to the transmitting second additional coil 1-L at the other end. On the memory card 10 side, the relative phase difference between the receiving first additional coil 2-R corresponding to the transmitting side additional coil and the second additional coil 2L is compared by the phase shifter (see the item shown in FIG. 5; in this case, the receiving amplifiers 6-R and 6-L function only as a simple waveform shaping circuit), and the power which is obtained by rectifying the signals by diodes D31 and D32 and smoothing them by a resistor 33 and a capacitor 34 is used as an external power supply (it is actually used via a 3-terminal voltage regulator IC but not illustrated), and the power supply is switched to a battery 35 by using a power source selector 36, and the power is supplied to the internal circuit of the memory card 10.

According to this second embodiment, the means for supplying the power to the card side which is necessary for high speed data transfer by electromagnetic coupling (transformer) from the personal computer (data server) side and a part of the means for coping with front-rear reverse insertion of a card can be shared, so that a contactless parallel transfer memory card which is miniature, light in weight, and extremely easily operable can be provided.

Next, the third embodiment will be explained with reference to the drawings.

Figure 7:
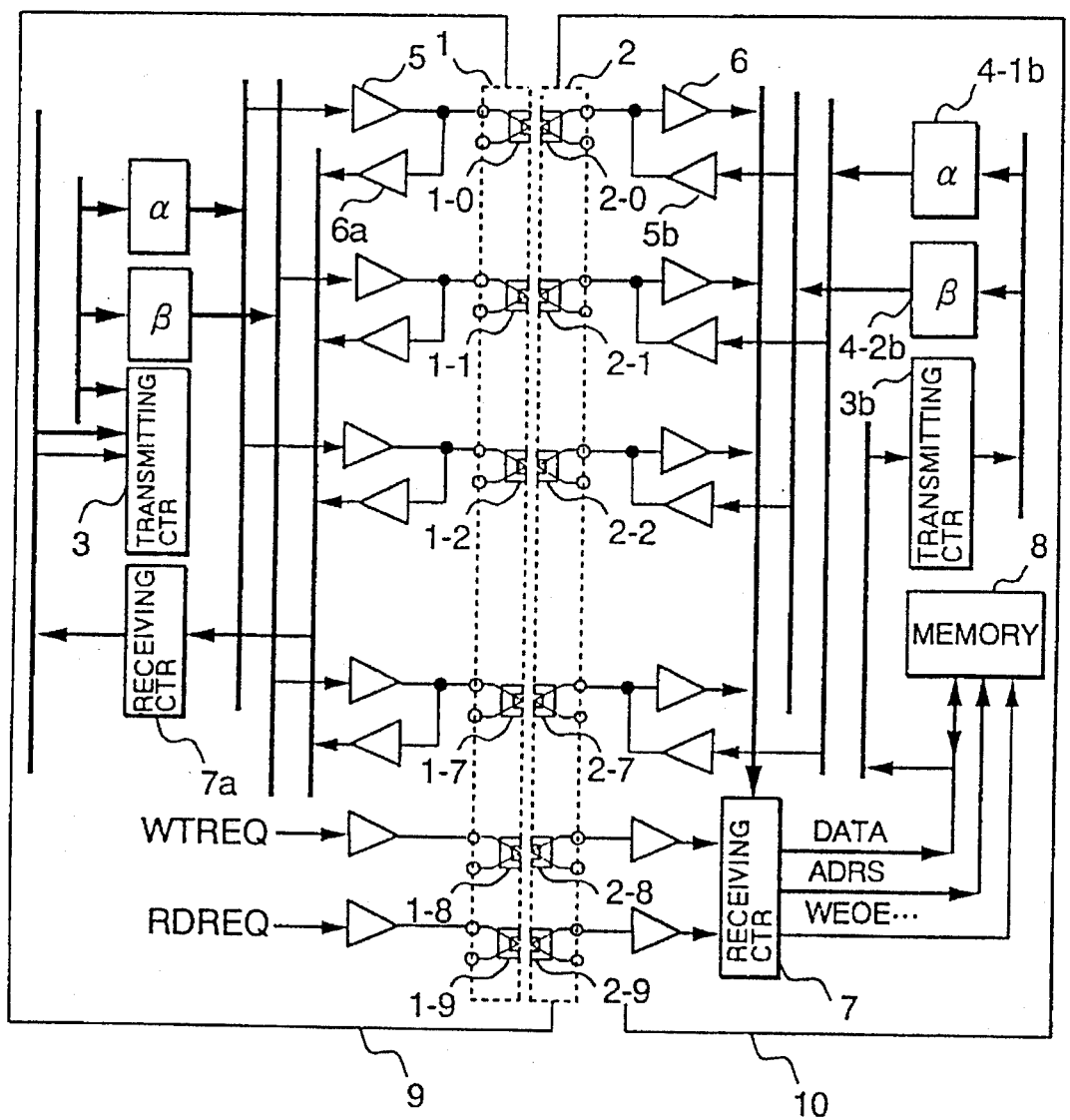
FIG. 7 is a block diagram of a data server and a contactless parallel transfer memory card showing the third embodiment.

FIG. 7 is a block diagram of a memory card system in which transfer coils are used for both of transmission and reception. The drawing corresponds to FIG. 1 in the first embodiment and the duplicated explanation will be omitted in principle. This embodiment uses a method for controlling writing and reading memory data by the data server 9 side. Writing or reading is executed by transferring WTREQ or REREQ to the receiving controller 7 on the memory card side via the transmitting coil 1-8 and the receiving coil 2-8 or the transmitting coil 1-9 and the receiving coil 2-9. Writing data when data is written into the memory 8 is transferred from the transmitting coil array 1 (although the transmitting coil array is used for both of transmission and reception in this embodiment, the name used in the first and second embodiments is taken over for convenience; the same may be said with the receiving coil array 2 and the coils 1-0 to 1-7 and 2-0 to 2-7 constituting the coil arrays and the conventional names are taken over for convenience) to the receiving coil array 2 via the transmitting controller 3, the $\alpha$ timing delay circuit 4-1, the $\beta$ timing delay circuit 4-2, and the coil driver 5 and written into the predetermined address of the memory 8 via the receiving amplifier 6 and the receiving controller 7. On the other hand, when the data written in the predetermined address of the memory 8 is read, by diverting the receiving coils 2-0 to 2-7 of the receiving coil array 2 to transmitting coils, the data is reversely transmitted to the data server 9 via a transmitting controller 3b, an $\alpha$ timing delay circuit 41b, a $\beta$ timing delay circuit 4-2b, and a coil driver 5b which are added (it means that they are added for comparison with FIG. 1; the same may be said with the following) to the memory card side. The data at the predetermined address of the memory 8 which is reversely transmitted is transferred to a receiving amplifier 6a which receives the data which is transferred by diverting the transmitting coil array 1 to receiving use and added to the data server 9 side and a receiving controller 7a which is also added and the memory data reading operation is performed. When both of the data server 9 side and the memory card 10 side are provided with a transmitting and receiving function as mentioned above, it means that a function for reading and checking data written into the memory immediately after writing, a so-called read after write check can be realized easily.

Figure 8:
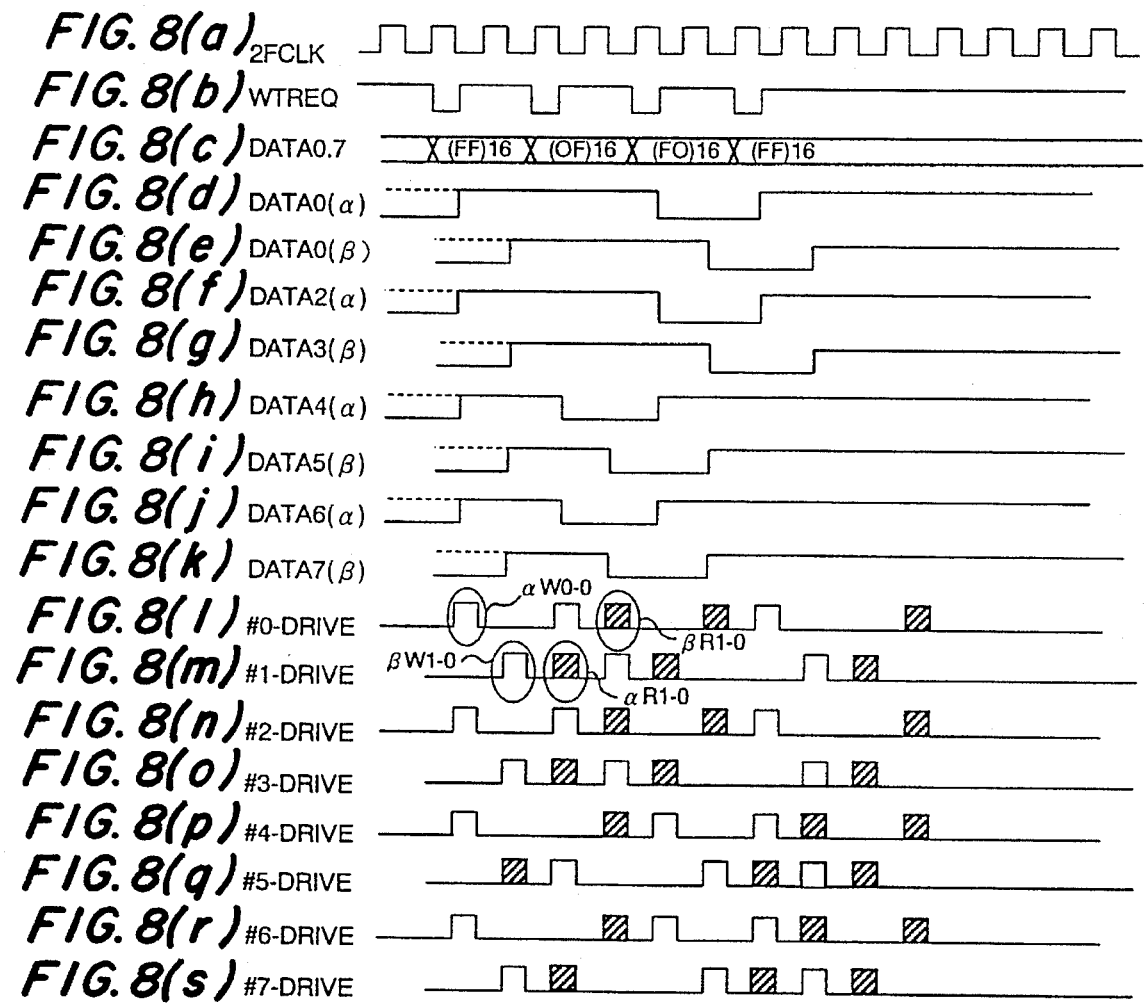
FIG. 8 is a time chart for explaining a part of the third embodiment.

FIG. 8 is a time chart when the aforementioned read after write check function is performed. The function will be explained with reference to FIG. 7. The clock given to the transmitting controller (3 shown in FIG. 7) is a square wave signal 2fCLK having a frequency which is two times of the transfer frequency (20 MHz in the embodiment) and data DATA0 to DATA7 which are to be written simultaneously with the write command WTCOM from the controller of the host computer (the data server 9 shown in FIG. 7) to the external memory card are given. In this embodiment, it is assumed that DATA0 to DATA7 are FF, 0F, F0, and FF (the last data) which are given in hexadecimal. To the latch register in the transmitting controller, the group (DATA0$\alpha$, DATA2$\alpha$, DATA4$\alpha$, DATA6$\alpha$) which operates in the $\alpha$ timing and the group (DATA1$\beta$, DATA3$\beta$, DATA5$\beta$, DATA7$\beta$) which operates in the $\beta$ timing are distributed alternately and data is set at the trailing edge of each timing. The output signals (#0-DRIVE, #2-DRIVE, #4-DRIVE, and #6-DRIVE) in which the register outputs DATA0$\alpha$, DATA2$\alpha$, DATA4$\alpha$, and DATA6$\alpha$ and a NOT signal of the $\alpha$ part of the aforementioned signal 2fCLK are ANDed and the output signals (#1-DRIVE, #3-DRIVE, #5-DRIVE, and #7-DRIVE) in which the register outputs DATA1$\beta$, DATA3$\beta$, DATA5$\beta$, and DATA7$\beta$ and a NOT signal of the $\beta$ part of the aforementioned signal 2fCLK are ANDed are the driving current waveforms to the individual coils (1-0 to 1-7 shown in FIG. 7) of the corresponding transmitting coil array (1 shown in FIG. 7). The aforementioned data writing operation is exactly the same as that in the first embodiment. However, the hatched parts in the waveforms of #0-DRIVE to #7-DRIVE in the drawing are reverse transmitted waveforms of the data which is read from the same address immediately after writing into the memory. Namely, the read reverse transmitting waveform corresponding to a 1 write signal $\alpha$W0-0 at the first time for bit 0 (#0-DRIVE) is $\beta$R0-0 and the read reverse transmitting waveform corresponding to a 1 write signal $\beta$W1-0 at the first time for bit 1 (#0DRIVE) is $\alpha$R1-0. Upon receipt of such reverse transmitting data, the data server 9 executes comparison with the previous transmitting data, checks whether an error occurs in the transfer system, and executes the predetermined error recovery processing.

When the dedicated control lines (WTREQ and RDREQ lines shown in FIG. 7) are made ready for bidirectional transfer, an error check is performed by the memory card side (it is possible when a parity bit is added or an EDC (error detect code) is added) and only when an error occurs as a result, data can be reversely transferred to the WTREQ or RDREQ line.

According to the third embodiment, not only bidirectional data transfer is made possible without the number of transmitting and receiving coils being increased but also the read after write function and the information function when an error occurs can be realized easily, so that a contactless parallel transfer memory card system which is miniature, light in weight, and highly reliable at the time of data transfer can be realized.

Next, the fourth embodiment will be explained with reference to the drawings.

Figure 9:
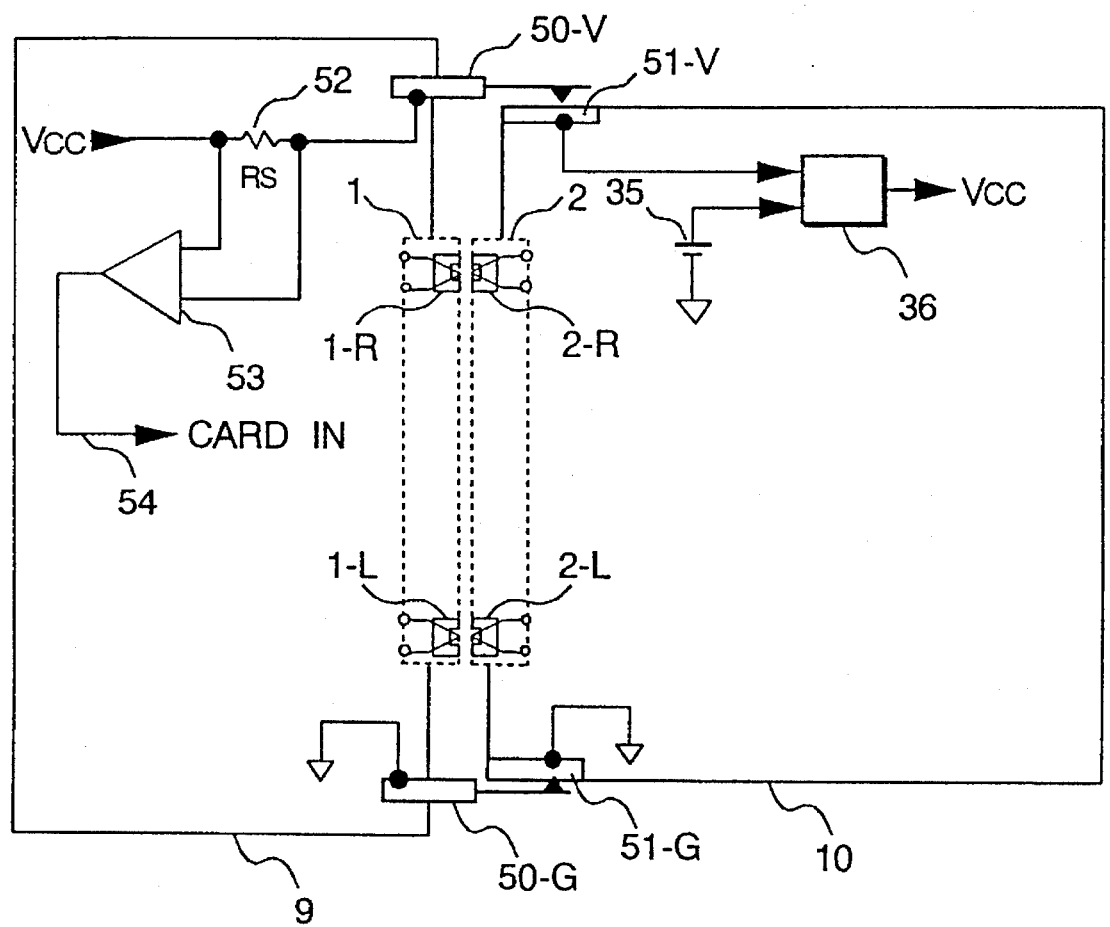
FIG. 9 is a block diagram showing the fourth embodiment.

FIG. 9 is a block diagram in which the characteristic part of the fourth embodiment is extracted. The data server 9 consists of the transmitting coil array 1, terminal conductors of DC-power out 50-V and 50-G, a sensing resistor 52, a card insert signal 54, and a voltage comparator 53. The omitted parts are the same as those in FIG. 1 showing the first embodiment basically. The contactless transfer memory card 10 consists of the receiving coil array 2, socket contact conductors of external DC-power 51 which are installed on the surface of the front-rear reverse insertion prevention groove, a battery 35, and a power source selector 36 and the omitted parts are the same as those in FIG. 1 showing the first embodiment basically. When the memory card 10 is inserted in the predetermined position of the data server 9, the socket contact conductor 51-V corresponding to the plus potential (VCC) supply terminal conductor 50-V and the socket contact conductor 51-G corresponding to the minus potential (GND) supply terminal conductor 50-G come in contact with each other. When a voltage is applied to the external power supply side of the power source selector 36, the power source selector 36 separates the built-in battery 35 and uses the power which is supplied from the socket contact conductor 51-V as power on the card side. When a current flows by supplying VCC on the data server side via the terminal conductors 50-V, 51-V, 51-G, and 50-G like this, a potential is generated at both ends of the sensing register 52 and the voltage comparator 53 is reversed and outputs a card insert signal 54. Upon receipt of the card insert signal 54, the controller of the data server (an illustration and detailed explanation will be omitted) starts transmission and reception of data. Transmission and reception of data are executed on a contactless basis by generating an induced voltage by electromagnetic coupling from the receiving coil 2-0 to the receiving coil 2-9 by flowing a pulse current from the transmitting coil 1-0 to the transmitting coil 1-9.

Figure 10:
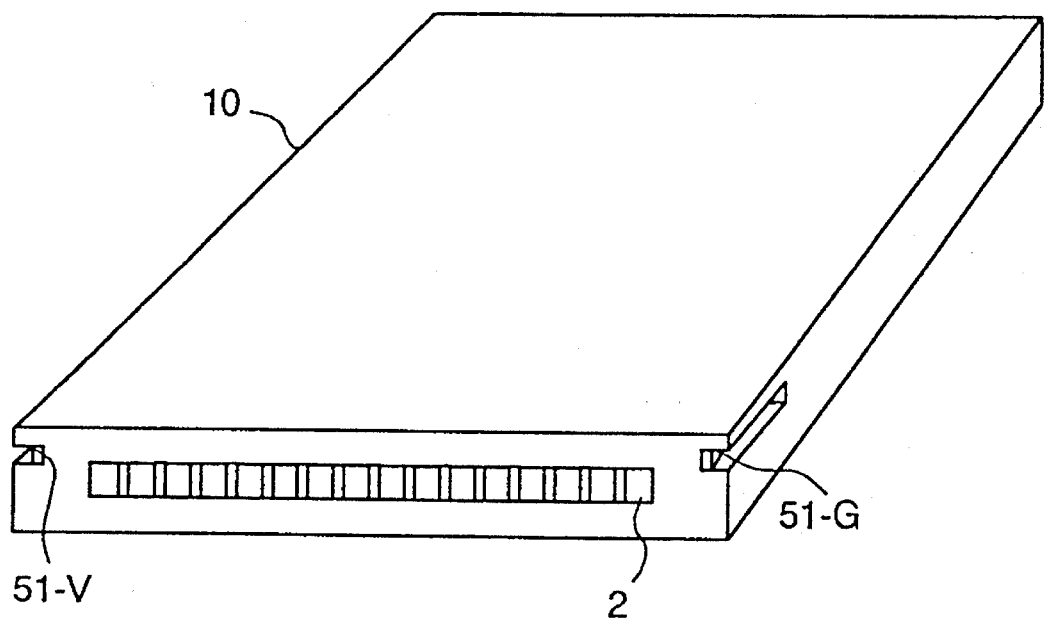
FIGS. 10(a) and 10(b) are appearance imaging diagrams showing the fourth embodiment.
Figure 10:
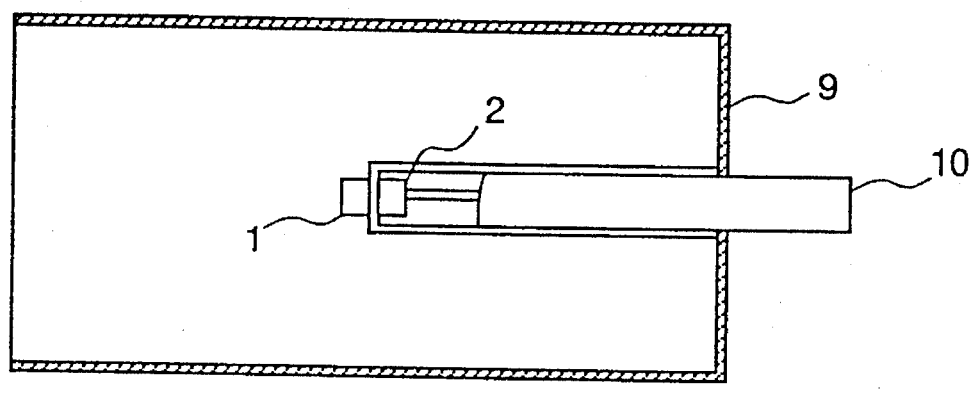

FIGS. 10(a) and 10(b) are appearance imaging diagrams showing the fourth embodiment.

FIG. 10(a) is an external solid figure of the IC memory card 10. Assuming that the upper side of the drawing is the front side and the lower side is the rear side, the socket contact conductors (terminals) 51-V and 51-G are fixed to the bottom of the reverse insertion prevention groove which is cut at the front-rear asymmetrical position and the receiving coil array 2 is covered with a thin mold substance and installed at the top of the card. The socket contact conductors 51 and the inside of the card 10 are physically sealed with a mold substance and structured so that air and water cannot be introduced inside.

FIG. 10(b) is a cross sectional view showing the concept of the status that the contactless card 10 is inserted into the data server 9. The drawing shows a case that the transmitting coil array 1 and the receiving coil array 2 are close to each other at a gap of about 0.5 mm and the relative positioning accuracy in the X and Y directions is about ±0.2 mm.

Figure 11:
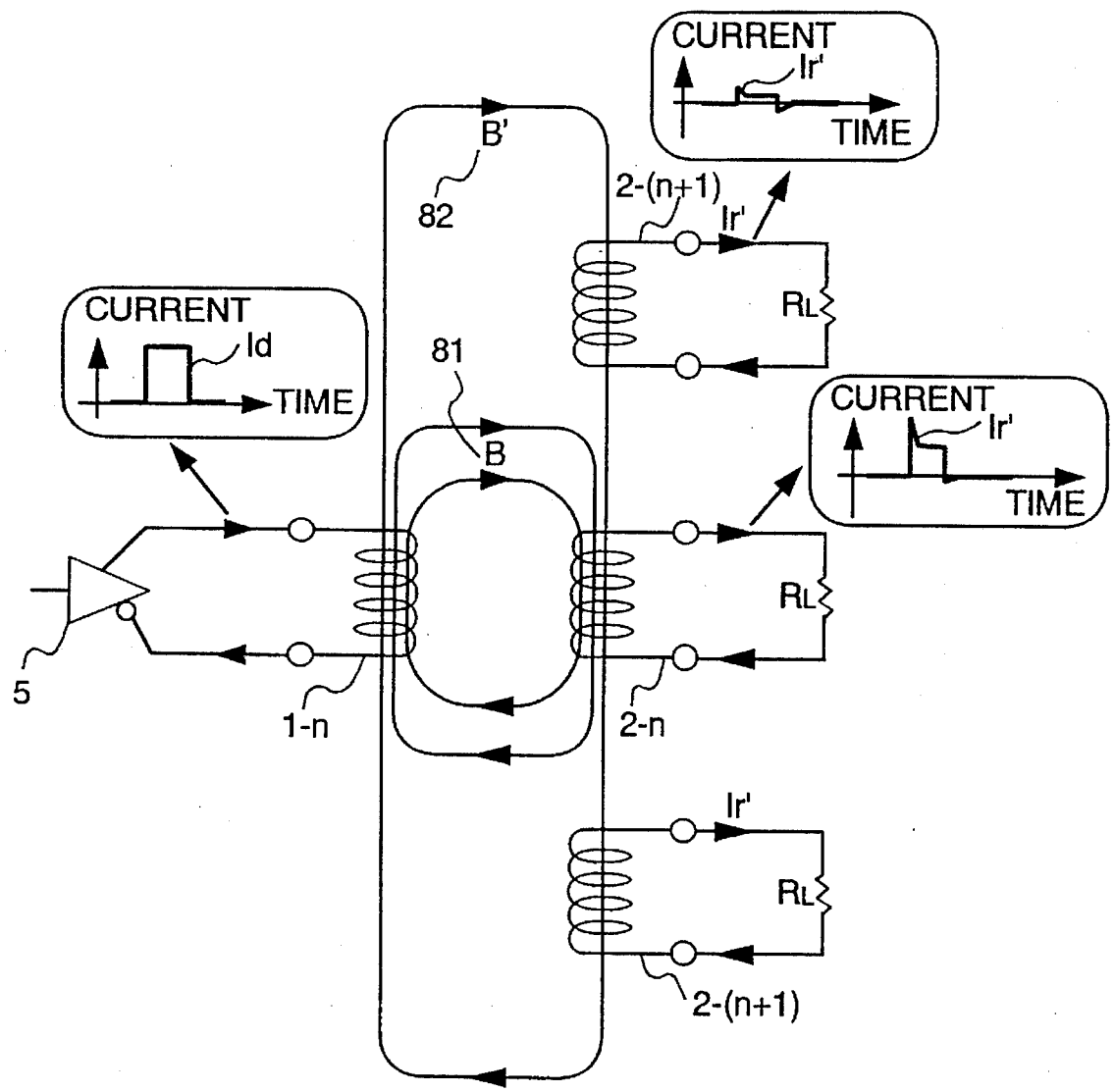
FIG. 11 is a principle block diagram showing the crosstalk noise generation mechanism.

FIG. 11 is a principle diagram showing the main cause of generation of crosstalk to the neighboring coil. The drawing shows the status that a transfer signal from the "n" th transmitting coil 1-n is electromagnetically coupled by the opposite receiving coil 2-n and the two receiving coils 2-(n−1) and 2-(n+1) thereto and an induced voltage is generated. Firstly, when the pulse current Id shown in the drawing flows through the transmitting coil 1-n by the coil driver 5, a magnetic flux in a density which is in proportion to the current ID and the number of turns of the receiving coil 1-n is generated. Although the main magnetic flux B81 passes through only the opposite receiving coil 2-n and returns, a part of the leakage flux B'82 passes also through the two neighboring receiving coils 2-(n−1) and 2-(n+1) and returns to the transmitting coil 1-n. As a result, an induced voltage which is in proportion to the passing magnetic flux density and the number of turns is generated in the receiving coil 2-n, and a pulse current Ir which is in inverse proportion to the load resistor RL is generated, and the regular signal component is transferred. However, as mentioned above, a part of the leakage flux B'82 passes through the two neighboring receiving coils 2-(n−1) and 2-(n+1). As a result, as shown in the drawing, a crosstalk current Ir' is generated in the two neighboring receiving coils 2-(n−1) and 2-(n+1).

Figure 12:
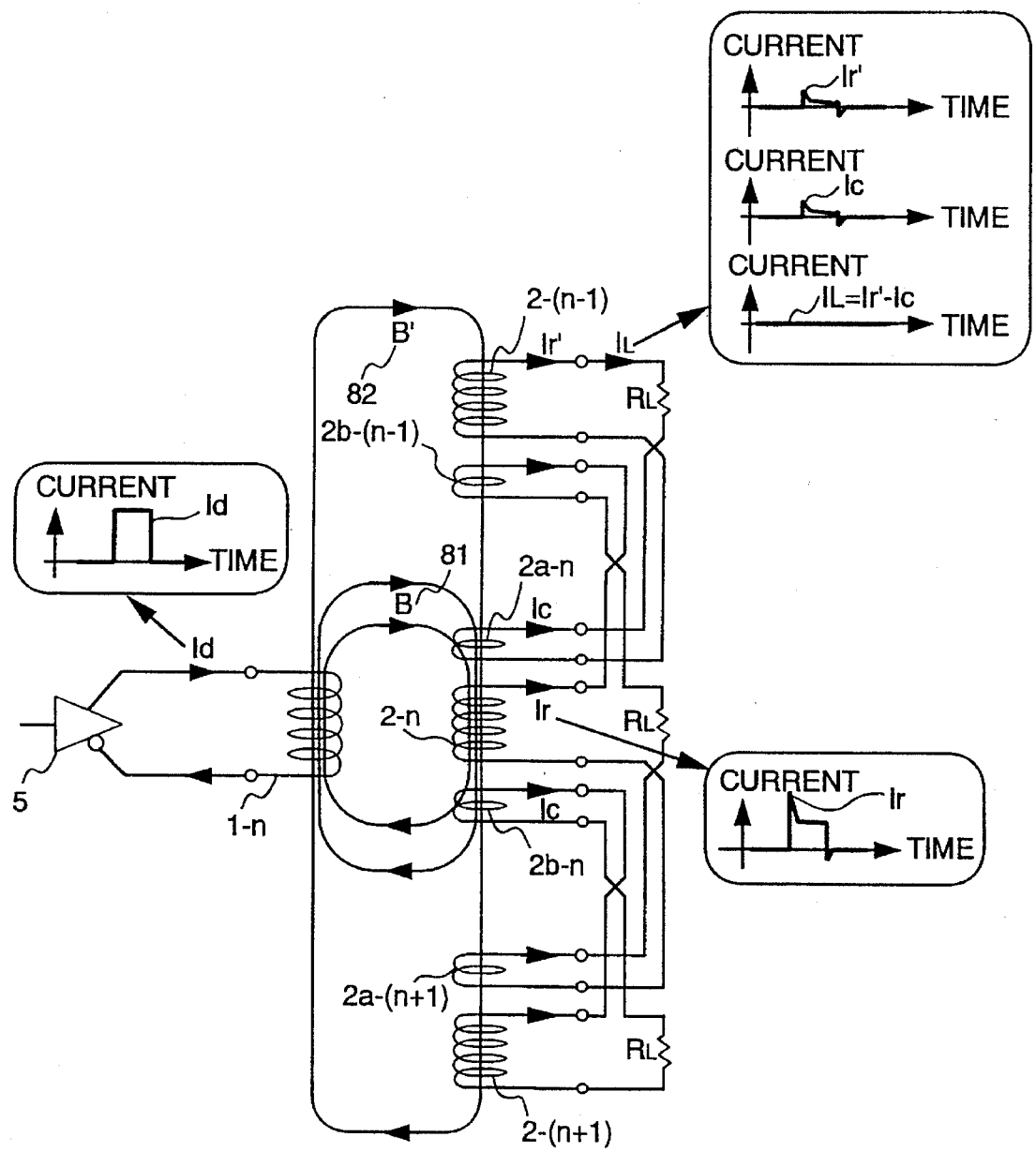
FIG. 12 is a block diagram showing the first method for a crosstalk noise reduction countermeasure which is used in the fourth embodiment.

FIG. 12 is a drawing showing the first crosstalk reducing method which is used in this embodiment. In this drawing, to avoid complexity, only one transmitting coil 1-n and the two neighboring receiving coils 2-(n−1) and 2-(n+1) are extracted and shown for convenience. The principle for generation of induced voltage to the receiving coils will be omitted because it is described in FIG. 11. A difference from FIG. 11 is that auxiliary coils 2a-n and 2b-n are installed for the receiving coil 2-n, and an auxiliary coil 2b-(n−1) is installed for the neighboring receiving coil 2-(n−1), and an auxiliary coil 2a-(n+1) is installed for the other neighboring receiving coil 2-(n+1) (although an auxiliary coil 2a-(n−1) is installed for the neighboring receiving coil 2-(n−1) and an auxiliary coil 2b-(n+1) is also installed for the other neighboring receiving coil 2-(n+1) actually, an illustration is omitted). The aforementioned auxiliary coils are set to the number of turns so as to generate a voltage equal to the crosstalk induced voltage to the neighboring coils, which is generated by the action of the leakage magnetic flux B'82, by the action of the magnetic flux B81 and the leakage magnetic flux B'82 and connected to the neighboring coils 2-(n−1) and 2-(n+1) so as to negate the crosstalk induced voltage (to reverse the phase). Namely, when the pulse current Id (see the illustrated waveform) of transmitting data by the coil driver 5 flows through the transmitting coil 1-n, a regular receiving signal current Ir is generated in the opposite receiving coil 2-n (see the illustrated waveform) and for example, as to the neighboring coil 2-(n−1), it operates in the direction that the crosstalk current Ir' induced in the coil 2-(n−1) and the induced current Id to the auxiliary coil 2a-n are offset each other and a current IL which flows in the load resistor of the neighboring coil 2-(n−1) becomes almost zero (see the illustrated waveform).

Figure 13:
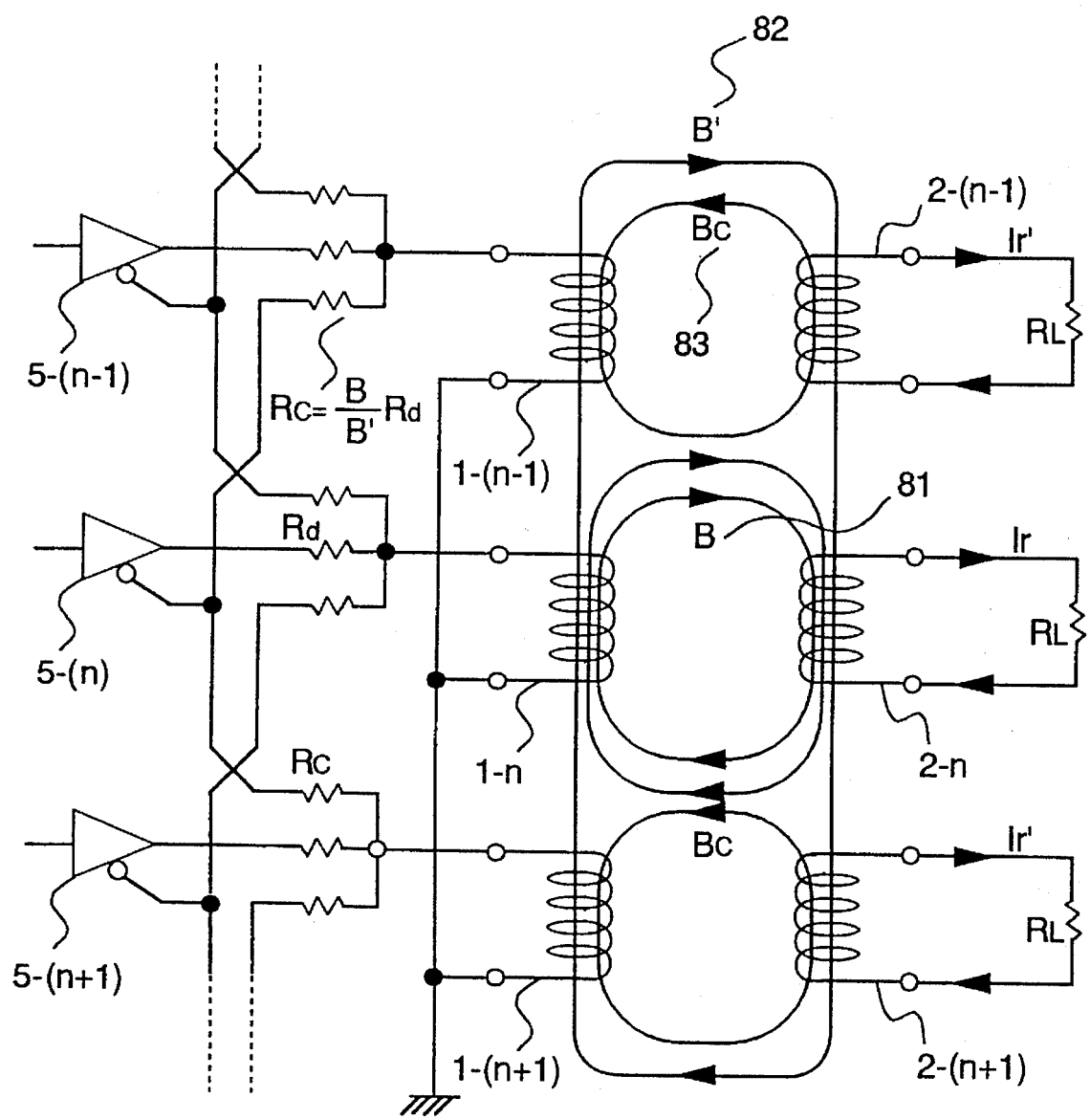
FIG. 13 is a block diagram showing the second method for a crosstalk noise reduction countermeasure which is used in the fourth embodiment.

FIG. 13 is a drawing showing the second crosstalk reducing method which is used in the fourth embodiment. Firstly, the positive side outputs of the coil drivers 5-(n−1), 5-n, and 5-(n+1) are limited by the resistor Rd so as to become the predetermined driving currents and connected to the corresponding transmitting coils 1-(n−1), 1-n, and 1-(n+1). On the other hand, the negative side outputs of the coil drivers 5-(n−1), 5-n, and 5-(n+1) are connected to the neighboring transmitting coils thereof via the resistor Rc, for example, as to the coil driver 5-n at the center of the drawing, the negative side output thereof is connected to the neighboring transmitting coils 1-(n−1) and 1-(n+1) via the individual resistor Rc respectively. The ratio of the resistor Rc to the resistor Rd is made almost equal to the ratio of the magnetic flux (density) B81 which acts on only the opposite regular receiving coil 2-n to the leakage magnetic flux (density) B'82 which acts on the neighboring receiving coils 2-(n−1) and 2-(n+1) and generates a crosstalk noise component (a little more accurately representing, the ratio decided in consideration of the synthetic magnetism transmission loss on the basis of the ratio of B+B' to B'). A magnetic flux Bc83 which is generated by the pulse current flowing through the neighboring transmitting coils 1-(n−1) and 1-(n+1) via the resistor Rc is in a density almost equal to that of the leakage magnetic flux B'82 and in the reverse direction. Therefore, the magnetic flus which acts on the neighboring receiving coils 2-(n−1) and 2-(n+1) to the regular receiving coil becomes almost zero, so that a crosstalk noise component current Ir' will not be generated.

According to this fourth embodiment, a transfer rate which is about 2 times compared with the crosstalk countermeasure by the phase shifter (the first to third embodiments) can be realized (in this embodiment, a maximum of 20 megabytes per second is ascertained).

Finally, an actual application example of a 10 contactless parallel transfer IC memory card will be explained with reference to FIGS. 14 and 15.

Figure 14:
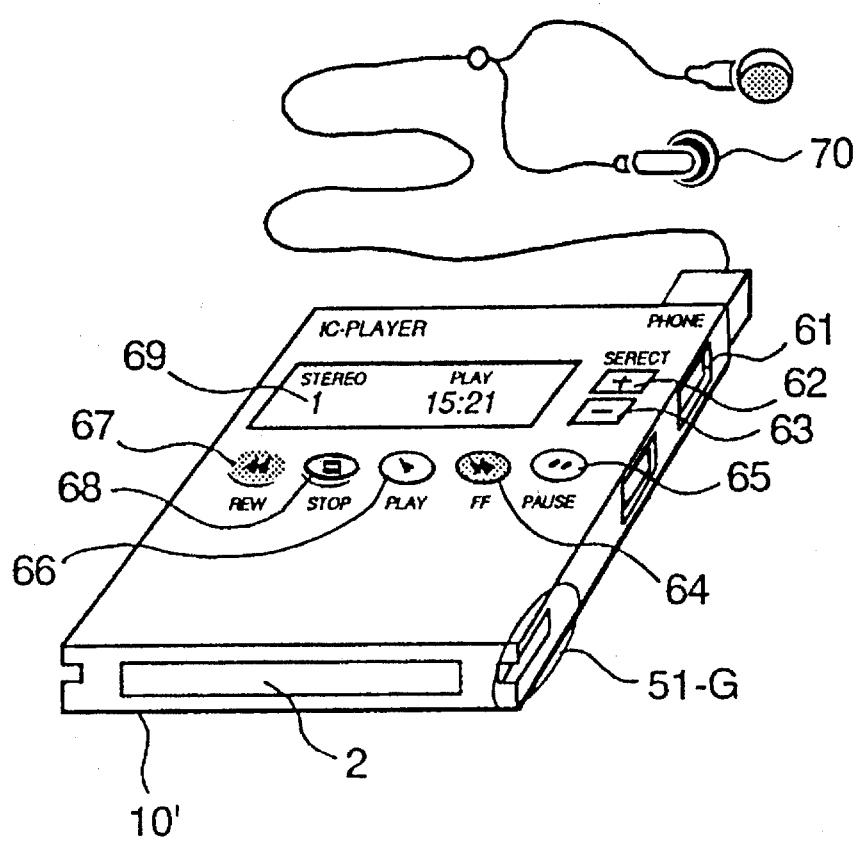
FIG. 14 is an external view of an IC player which is an actual application example of a contactless parallel transfer card.

FIG. 14 is an external view of an IC player 10' which applies a contactless parallel transfer IC memory card. A power switch 61 is turned to the ON position, and acoustic information which is changed to compressed code information is written into the internal memory from the receiving coil array 2 at a high-speed transfer rate (10 megabytes per second), and then recorded acoustic information in the memory which is reproduced sequentially can be listened to with an earphone 70 held to an ear by operating a <PLAY> switch 66. When a plurality of music informations are recorded in the memory, a selection <+> switch 62 and a selection <—> switch 63 are operated, and the music name and number are ascertained on a liquid crystal display panel 69, and the music is reproduced by operating the <PLAY> switch 66, and fast listening, fast rewinding, and pausing are executed by operating a <FF> switch 64, a <REW> switch 67, and a <PAUSE> switch 65 respectively, and reproduction operation ending is executed by operating a <STOP> switch 68.

Figure 15:
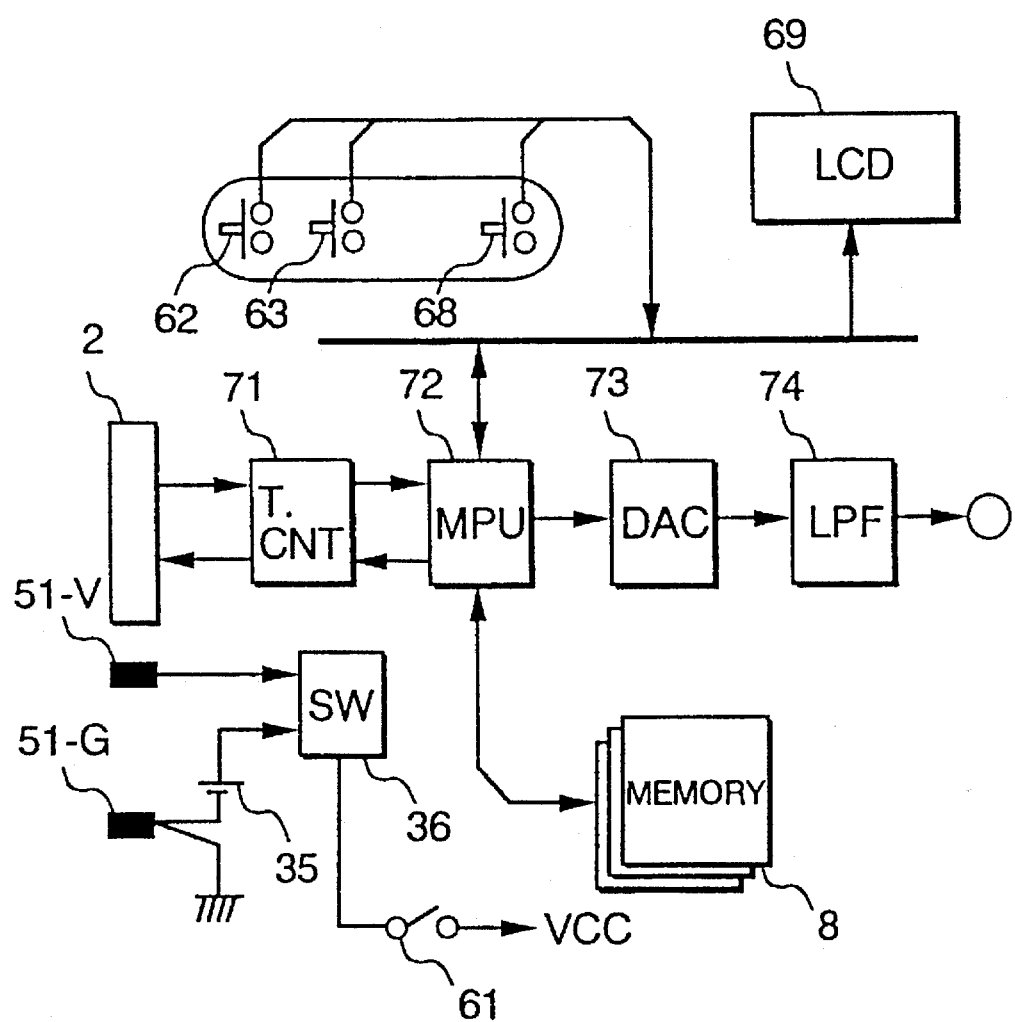
FIG. 15 is a block diagram showing the circuit constitution of an IC player which is an actual application example of a contactless parallel transfer card.

FIG. 15 is a block diagram showing the circuit constitution in the IC player 10' which applies the aforementioned contactless parallel transfer IC memory card. Compressed acoustic code information is inputted from the receiving coil array 2 and recorded in the memory 8 via a transfer controller 71 and a microprocessor 72. When the reproduction operation is executed by operating the switches 61, 62, 63, - - -, and 68 by ascertaining the music name and number on the liquid crystal display panel 69, the compressed acoustic code information which is recorded in the memory 8 is extended by the microprocessor 72, returned to an analog signal by a D-A converter 73, and outputted via a low-pass filter serving as an amplifier. As a power source during the normal operation, the built-in battery 35 is selected by the power source selector 36. However, when the card is set so as to absorb information from the data server (information server), power is supplied via the socket contact conductors 51-V and 51-G which are installed in the front-rear (top and bottom) reverse insertion prevention groove part of the card, and the power source selector 36 separates the built-in battery 35, and the card uses the external supply power.

According to this embodiment, an IC recorder which has an instantaneous dubbing function which can record acoustic information for about 70 minutes in a 32-megabyte memory for about 3 seconds and which has a superior environment resistance such as waterproofness can be realized easily.

As explained in various embodiments above, according to the present invention, in the contactless parallel transfer system using a plurality of electromagnetic coupling coils, also for the dimension of transfer coils which decreases in inverse proportion to an increase of the number of parallel transfer bits and the coil space which becomes narrower, a malfunction due to crosstalk between the coils which is the most serious obstacle can be prevented perfectly. Therefore, an electromagnetic coupling type contactless parallel transfer card system which is miniature, highly densed, and ready for high speed transfer can be provided on a high reliability basis.

Since the instantaneous peak current accompanying parallel simultaneous transfer is leveled, the burden imposed on the power circuit system is lightened, and the noise energy caused by a pulse current is reduced, and a system which is miniature, highly densed, and highly reliable can be realized.

Furthermore, since the power supply coil at the time of data transfer and the memory card upside-down insertion detector can be shared, an electromagnetic coupling type contactless parallel transfer card system which is miniature and easily operable can be provided on a high reliability basis.

What is claimed is:

1. A contactless parallel data transfer device comprising:
   a portable memory:
      a first coil group which is installed in said portable memory so as to transfer access data to said portable memory in parallel;
      a data server for supplying at least writing data to said portable memory;
      a second coil group which consists of each coil mounted opposite to each coil of said first coil group and is installed in said data server so as to transfer data from said data server to said first coil group;
      contactless holding means for holding said first coil group and said second coil group opposite and close to each other so as to transfer data; and
      a parallel pulse generator having a delay means which generates data to be transferred between said first coil group and said second coil group in parallel as a parallel pulse and is installed at least in said data server, wherein said delay means is a means for dividing said parallel pulse at least into a first parallel pulse group consisting of a first number of bits and a second parallel pulse group consisting of a second number of bits and delaying the parallel transfer timing of said second parallel pulse group from the parallel transfer timing of said first parallel pulse group at least by a time which is longer than the pulse width of each bit.

2. A contactless parallel data transfer device according to claim 1, wherein said portable memory is a memory card having a built-in IC memory.

3. A contactless parallel data transfer device according to claim 1, wherein at least said first and second parallel pulse groups are distributed so that the coils neighboring to each other are in different timings.

4. A contactless parallel data transfer device according to claim 1, further comprising:
   a gate circuit for selecting the corresponding timing for each receiving coil for the coil group for receiving said first and second parallel pulse groups.

5. A contactless parallel data transfer device comprising:
   a portable memory:
      a first coil group which is installed in said portable memory so as to transfer access data to said portable memory in parallel;
      a data server for supplying at least writing data to said portable memory;
      a second coil group which consists of each coil mounted opposite to each coil of said first coil group and is installed in said data server so as to transfer data from said data server to said first coil group;
      contactless holding means for holding said first coil group and said second coil group opposite and close to each other so as to transfer data; and
      a parallel pulse generator which generates data to be transferred between said first coil group and said second coil group in parallel as a parallel pulse and is installed at least in said data server; and
      means for supplying a part of a transfer signal from at least one coil among said first coil pair to said neighboring receiving side coil in the opposite phase so as to negate the crosstalk component which is generated in the neighboring receiving side coil for the first coil pair among the opposite coil pairs of said first and second coil groups.

6. A contactless parallel data transfer device according to claim 1, wherein said means for supplying in the opposite phase is means for supplying an offset current in the opposite phase to at least one neighboring receiving side coil from the receiving side coil of said first coil pair.

7. A contactless parallel data transfer device according to claim 1, wherein said means for supplying in the opposite phase is means for supplying an offset current in the opposite phase to at least one neighboring transmitting side coil from the transmitting side coil of said first coil pair.

8. A contactless parallel data transfer device according to claim 1, wherein said portable memory has means for transferring data in parallel from said first coil group to said second coil group and said first coil group and said second coil group transfer data in two ways.

9. A contactless parallel data transfer device according to claim 1, wherein said data server and said memory card further comprise are contact electrode terminal conductors for supplying the power and grounding potential from said data server to said memory card.

10. A contactless parallel data transfer device according to claim 2, further comprising:

a grooved part for top-bottom reverse insertion prevention which is installed on the side of said memory card; and an electrode terminal conductor for receiving the power supply installed in said grooved part and the grounding potential.

11. A contactless parallel data transfer device according to claim 8, further comprising:

means for detecting whether the current of the power source to said memory card from said data server is more than the predetermined constant current or not and detecting that said memory card is inserted into said data server.

12. IC memory card comprising:

a first coil group which is installed so as to transfer access data to a second coil group installed in a data server in parallel opposite to each coil; and at least one means among means for generating data which is transferred in parallel with said second coil group close and opposite to said first coil group for each coil as a parallel pulse and means for receiving it as a parallel pulse, wherein said parallel pulse consists of a parallel pulse for dividing it at least into a first parallel pulse group consisting of a first number of bits and a second parallel pulse group consisting of a second number of bits and delaying the parallel transfer timing of said second parallel pulse group from the parallel transfer timing of said first parallel pulse group at least by a time which is longer than the pulse width of each bit.

13. IC memory card comprising:

a first coil group which is installed so as to transfer access data to a second coil group installed in a data server in parallel opposite to each coil; and at least one means among means for generating data which is transferred in parallel with said second coil group close and opposite to said first coil group for each coil as a parallel pulse and means for receiving it as a parallel pulse; and means for supplying a part of a transfer signal from the coil of said first coil group corresponding to said first coil pair to said neighboring coil of said first coil group in the opposite phase so as to negate the crosstalk component which is generated in the receiving side coil which is neighboring with said coil pair for the first coil pair among the opposite coil pairs of said first and second coil groups.

14. IC memory card according to claim 11, wherein said first and second coil groups are distributed and installed symmetrically about the direction perpendicular to the center line of said IC memory card respectively against the insertion surface of said IC memory card which is installed in said data server so as to make said first and second coil groups close and opposite to each other and said first coil group has coils on the memory card side which are installed at both ends of said first coil group among the coil pair for transferring signals shifted at 90° in phase which are installed at both ends of said each coil group.

15. IC memory card according to claim 13, further comprising:

means for interchanging the array order of parallel pulses of said first coil group on the basis of said signals shifted at 90° in phase when the coils on the memory card side which are installed at both ends of said first coil group receive said signals.

16. IC memory card according to claim 13, further comprising:

means for using said signals shifted at 90° in phase which are received by the coils on the memory card side which are installed at both ends of said first coil group as an external supply source for said memory card.

17. IC memory card according to claim 12, wherein said first and second coil groups are distributed and installed symmetrically about the direction perpendicular to the center line of said IC memory card respectively against the insertion surface of said IC memory card which is installed in said data server so as to make said first and second coil groups close and opposite to each other and said first coil group coils on the memory card side which are installed at both ends of said first coil group among the coil pair for transferring signals shifted at 90° in phase which are installed at both ends of said each coil group.

18. IC memory card according to claim 16, further comprising:

means for interchanging the array order of parallel pulses of said first coil group on the basis of said signals shifted at 90° in phase when the coils on the memory card side which are installed at both ends of said first coil group receive said signals.

19. IC memory card according to claim 16, further comprising:

means for using said signals shifted at 90° in phase which are received by the coils on the memory card side which are installed at both ends of said first coil group as an external supply source for said memory card.

20. A contactless parallel data transfer method in a contactless parallel data transfer device having:

a portable memory:

a first coil group which is installed in said portable memory so as to transfer access data to said portable memory in parallel;

a data server for supplying at least writing data to said portable memory; and a second coil group which consists of each coil mounted opposite to each coil of said first coil group and is installed in said data server so as to transfer data from said data server to said first coil group, comprising:

a contactless holding step for holding said first coil group and said second coil group opposite and close to each other so as to transfer data; and a parallel pulse generating step which generates data to be transferred between said first coil group and said second coil group in parallel as a parallel pulse and is installed at least in said data server, wherein said parallel pulse generating step includes a step for dividing said parallel pulse at least into a first parallel pulse group consisting of a first number of bits and a second parallel pulse group consisting of a second number of bits and delaying the parallel transfer timing of said second parallel pulse group from the parallel transfer timing of said first parallel pulse group at least by a time which is longer than the pulse width of each bit.

21. A contactless parallel data transfer method according to claim 19, wherein said portable memory is memory card having a built-in IC memory.

22. A contactless parallel data transfer method according to claim 19, wherein at least said first and second parallel pulse groups are distributed so that the coils neighboring to each other are in different timings.

23. A contactless parallel data transfer method according to claim 19, further comprising:

a step for selecting the corresponding timing for each receiving coil for the coil group for receiving said first and second parallel pulse groups.

* * * * *